US007776622B2

(12) United States Patent
Nagai

(10) Patent No.: US 7,776,622 B2
(45) Date of Patent: Aug. 17, 2010

(54) METHOD FOR FABRICATING SEMICONDUCTOR DEVICES

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 429 days.

(21) Appl. No.: 11/865,925

(22) Filed: Oct. 2, 2007

(65) Prior Publication Data

US 2008/0081381 A1 Apr. 3, 2008

(30) Foreign Application Priority Data

Oct. 2, 2006 (JP) ............................ 2006-270708

(51) Int. Cl.
*H01L 21/00* (2006.01)

(52) U.S. Cl. .................. 438/3; 257/295; 257/E27.104; 257/E29.164; 257/E21.209; 257/E21.663; 257/E21.664

(58) Field of Classification Search .................... 438/3; 257/E27.104, E29.164, E21.209, E21.663, 257/E21.664

See application file for complete search history.

(56) References Cited

U.S. PATENT DOCUMENTS

2002/0040988 A1* 4/2002 Hidaka et al. ............... 257/296
2003/0157734 A1* 8/2003 Engelhardt et al. ............. 438/3
2003/0199104 A1* 10/2003 Leuschner et al. ............. 438/3
2006/0118913 A1* 6/2006 Yi et al. ...................... 257/613
2006/0175642 A1* 8/2006 Dote et al. .................. 257/295

FOREIGN PATENT DOCUMENTS

JP 2184045 A 7/1990
JP 11354604 A 12/1999
JP 2006100405 A 4/2006
JP 2006108268 A 4/2006

* cited by examiner

*Primary Examiner*—Ha Tran T Nguyen
*Assistant Examiner*—Aaron A Dehne
(74) *Attorney, Agent, or Firm*—Westerman, Hattori, Daniels & Adrian, LLP

(57) ABSTRACT

A semiconductor device fabrication method that improves the efficiency of semiconductor device production. A plurality of wafer substrates are set and a process for fabricating semiconductor devices each having a ferroelectric capacitor is begun. After ferroelectric layers are formed over the plurality of wafer substrates, the ferroelectric layers formed are damaged. The plurality of wafer substrates are then rearranged and treatment is performed. In each step in which the ferroelectric layers formed may be damaged, the plurality of wafer substrates are rearranged and treatment is performed. As a result, retention characteristic variations among wafer substrates in the same lot are reduced and the productivity of semiconductor devices is improved.

20 Claims, 24 Drawing Sheets

START
SET PLURALITY OF WAFER SUBSTRATES — S1
BEGIN PROCESS — S2
FERROELECTRIC LAYERS DAMAGED — S3
REARRANGE PLURALITY OF WAFER SUBSTRATES AND PERFORM TREATMENT — S4
COMPLETE PROCESS — S5
END

FIG. 18

| STEP | DRAWING NUMBER | TREAT-MENT | PLASMA | HEAT | BIAS |
|---|---|---|---|---|---|
| A | 2 | ETCHING | ○ | | |
| B | 2 | ETCHING | ○ | | |
| C | 3 | ETCHING | ○ | | |
| | 3 | CVD | | | ○ |
| D | 4 | CVD | ○ | ○ | |
| E | 4 | ETCHING | ○ | | |
| | 5 | PVD | | ○ | |
| | 5 | CVD | | ○ | |
| F | 5 | CVD | ○ | ○ | |
| G | 6 | ETCHING | ○ | | |
| H | 7 | ETCHING | ○ | | |
| | 7 | PVD | | ○ | |
| I | 8 | ETCHING | ○ | | |
| | 8 | PVD | | ○ | |
| | 9 | CVD | | | ○ |
| J | 9 | CVD | ○ | ○ | |
| | 9 | CVD | | | ○ |
| K | 9 | CVD | ○ | ○ | |
| | 9 | CVD | | | ○ |
| L | 9 | CVD | ○ | ○ | |
| M | 10 | ETCHING | ○ | | |
| | 10 | PVD | | ○ | |

FIG. 19

| STEP | DRAWING NUMBER | TREAT-MENT | PLASMA | HEAT | BIAS |
|---|---|---|---|---|---|
| | 11 | PVD | | ○ | |
| | 11 | CVD | | ○ | |
| N | 11 | ETCHING | ○ | | |
| | 12 | PVD | | ○ | |
| O | 12 | ETCHING | ○ | | |
| | 12 | CVD | | | ○ |
| P | 12 | CVD | ○ | ○ | |
| | 12 | CVD | | | ○ |
| Q | 12 | CVD | ○ | ○ | |
| | 12 | CVD | | | ○ |
| R | 12 | CVD | ○ | ○ | |
| S | 13 | ETCHING | ○ | | |
| | 13 | PVD | | ○ | |
| | 14 | PVD | | ○ | |
| | 14 | CVD | | ○ | |
| T | 14 | ETCHING | ○ | | |
| | 15 | PVD | | ○ | |
| U | 15 | ETCHING | ○ | | |
| | 16 | CVD | | | ○ |
| V | 16 | CVD | ○ | ○ | |
| | 16 | CVD | | | ○ |
| W | 17 | ETCHING | ○ | | |
| | 17 | PVD | | ○ | |

→ ORDER OF TREATMENT / POSITION OF Si WAFER SUBSTRATE

| STEP | TOTAL AMOUNT | 0 | 0 | 0 | 0 | 0 | 0 | 0 | 0 | 0 | 0 | 0 | 0 |
|---|---|---|---|---|---|---|---|---|---|---|---|---|---|
| SET | Si WAFER SUBSTRATE NUMBER | 1 | 2 | 3 | 4 | 5 | 6 | 7 | 8 | 9 | 10 | 11 | 12 |

| STEP | TOTAL AMOUNT | 4 | 3 | 2 | 1 | 0 | 0 | 0 | 0 | 0 | 0 | 0 | 0 |
|---|---|---|---|---|---|---|---|---|---|---|---|---|---|
| A | Si WAFER SUBSTRATE NUMBER | 1 | 2 | 3 | 4 | 5 | 6 | 7 | 8 | 9 | 10 | 11 | 12 |

| STEP | TOTAL AMOUNT | 5 | 3 | 2 | 1 | 0 | 0 | 0 | 0 | 0 | 2 | 3 | 4 |
|---|---|---|---|---|---|---|---|---|---|---|---|---|---|
| B | Si WAFER SUBSTRATE NUMBER | 4 | 5 | 6 | 7 | 8 | 9 | 10 | 11 | 12 | 3 | 2 | 1 |

| STEP | TOTAL AMOUNT | 5 | 3 | 2 | 1 | 0 | 0 | 2 | 3 | 4 | 2 | 3 | 5 |
|---|---|---|---|---|---|---|---|---|---|---|---|---|---|
| C | Si WAFER SUBSTRATE NUMBER | 7 | 8 | 9 | 10 | 11 | 12 | 3 | 2 | 1 | 6 | 5 | 4 |

| STEP | TOTAL AMOUNT | 5 | 3 | 2 | 3 | 3 | 4 | 2 | 3 | 5 | 2 | 3 | 5 |
|---|---|---|---|---|---|---|---|---|---|---|---|---|---|
| D | Si WAFER SUBSTRATE NUMBER | 10 | 11 | 12 | 3 | 2 | 1 | 6 | 5 | 4 | 9 | 8 | 7 |

| STEP | TOTAL AMOUNT | 7 | 6 | 6 | 3 | 3 | 5 | 2 | 3 | 5 | 2 | 3 | 5 |
|---|---|---|---|---|---|---|---|---|---|---|---|---|---|
| E | Si WAFER SUBSTRATE NUMBER | 3 | 2 | 1 | 6 | 5 | 4 | 9 | 8 | 7 | 12 | 11 | 10 |

| STEP | TOTAL AMOUNT | 7 | 6 | 7 | 3 | 3 | 5 | 2 | 3 | 5 | 6 | 6 | 7 |
|---|---|---|---|---|---|---|---|---|---|---|---|---|---|
| F | Si WAFER SUBSTRATE NUMBER | 6 | 5 | 4 | 9 | 8 | 7 | 12 | 11 | 10 | 1 | 2 | 3 |

| STEP | TOTAL AMOUNT | 7 | 6 | 7 | 3 | 3 | 5 | 6 | 6 | 7 | 7 | 6 | 7 |
|---|---|---|---|---|---|---|---|---|---|---|---|---|---|
| G | Si WAFER SUBSTRATE NUMBER | 9 | 8 | 7 | 12 | 11 | 10 | 1 | 2 | 3 | 4 | 5 | 6 |

| STEP | TOTAL AMOUNT | 7 | 6 | 7 | 7 | 6 | 7 | 7 | 6 | 7 | 7 | 6 | 7 |
|---|---|---|---|---|---|---|---|---|---|---|---|---|---|
| H | Si WAFER SUBSTRATE NUMBER | 12 | 11 | 10 | 1 | 2 | 3 | 4 | 5 | 6 | 7 | 8 | 9 |

| STEP | TOTAL AMOUNT | 11 | 9 | 9 | 8 | 6 | 7 | 7 | 6 | 7 | 7 | 6 | 7 |
|---|---|---|---|---|---|---|---|---|---|---|---|---|---|
| I | Si WAFER SUBSTRATE NUMBER | 1 | 2 | 3 | 4 | 5 | 6 | 7 | 8 | 9 | 10 | 11 | 12 |

| STEP | TOTAL AMOUNT | 12 | 9 | 9 | 8 | 6 | 7 | 7 | 6 | 7 | 9 | 9 | 11 |
|---|---|---|---|---|---|---|---|---|---|---|---|---|---|
| J | Si WAFER SUBSTRATE NUMBER | 4 | 5 | 6 | 7 | 8 | 9 | 10 | 11 | 12 | 3 | 2 | 1 |

| STEP | TOTAL AMOUNT | 12 | 9 | 9 | 8 | 6 | 7 | 9 | 9 | 11 | 9 | 9 | 12 |
|---|---|---|---|---|---|---|---|---|---|---|---|---|---|
| K | Si WAFER SUBSTRATE NUMBER | 7 | 8 | 9 | 10 | 11 | 12 | 3 | 2 | 1 | 6 | 5 | 4 |

| STEP | TOTAL AMOUNT | 12 | 9 | 9 | 10 | 9 | 11 | 9 | 9 | 12 | 9 | 9 | 12 |
|---|---|---|---|---|---|---|---|---|---|---|---|---|---|
| L | Si WAFER SUBSTRATE NUMBER | 10 | 11 | 12 | 3 | 2 | 1 | 6 | 5 | 4 | 9 | 8 | 7 |

| STEP | TOTAL AMOUNT | 14 | 12 | 13 | 10 | 9 | 12 | 9 | 9 | 12 | 9 | 9 | 12 |
|---|---|---|---|---|---|---|---|---|---|---|---|---|---|
| M | Si WAFER SUBSTRATE NUMBER | 3 | 2 | 1 | 6 | 5 | 4 | 9 | 8 | 7 | 12 | 11 | 10 |

FIG. 20

→ ORDER OF TREATMENT / POSITION OF Si WAFER SUBSTRATE

| STEP | TOTAL AMOUNT | 14 | 12 | 14 | 10 | 9 | 12 | 9 | 9 | 12 | 13 | 12 | 14 |
|---|---|---|---|---|---|---|---|---|---|---|---|---|---|
| N | Si WAFER SUBSTRATE NUMBER | 6 | 5 | 4 | 9 | 8 | 7 | 12 | 11 | 10 | 1 | 2 | 3 |

| STEP | TOTAL AMOUNT | 14 | 12 | 14 | 10 | 9 | 12 | 13 | 12 | 14 | 14 | 12 | 14 |
|---|---|---|---|---|---|---|---|---|---|---|---|---|---|
| O | Si WAFER SUBSTRATE NUMBER | 9 | 8 | 7 | 12 | 11 | 10 | 1 | 2 | 3 | 4 | 5 | 6 |

| STEP | TOTAL AMOUNT | 14 | 12 | 14 | 14 | 12 | 14 | 14 | 12 | 14 | 14 | 12 | 14 |
|---|---|---|---|---|---|---|---|---|---|---|---|---|---|
| P | Si WAFER SUBSTRATE NUMBER | 12 | 11 | 10 | 1 | 2 | 3 | 4 | 5 | 6 | 7 | 8 | 9 |

| STEP | TOTAL AMOUNT | 18 | 15 | 16 | 15 | 12 | 14 | 14 | 12 | 14 | 14 | 12 | 14 |
|---|---|---|---|---|---|---|---|---|---|---|---|---|---|
| Q | Si WAFER SUBSTRATE NUMBER | 1 | 2 | 3 | 4 | 5 | 6 | 7 | 8 | 9 | 10 | 11 | 12 |

| STEP | TOTAL AMOUNT | 19 | 15 | 16 | 15 | 12 | 14 | 14 | 12 | 14 | 16 | 15 | 18 |
|---|---|---|---|---|---|---|---|---|---|---|---|---|---|
| R | Si WAFER SUBSTRATE NUMBER | 4 | 5 | 6 | 7 | 8 | 9 | 10 | 11 | 12 | 3 | 2 | 1 |

| STEP | TOTAL AMOUNT | 19 | 15 | 16 | 15 | 12 | 14 | 16 | 15 | 18 | 16 | 15 | 19 |
|---|---|---|---|---|---|---|---|---|---|---|---|---|---|
| S | Si WAFER SUBSTRATE NUMBER | 7 | 8 | 9 | 10 | 11 | 12 | 3 | 2 | 1 | 6 | 5 | 4 |

| STEP | TOTAL AMOUNT | 19 | 15 | 16 | 17 | 15 | 18 | 16 | 15 | 19 | 16 | 15 | 19 |
|---|---|---|---|---|---|---|---|---|---|---|---|---|---|
| T | Si WAFER SUBSTRATE NUMBER | 10 | 11 | 12 | 3 | 2 | 1 | 6 | 5 | 4 | 9 | 8 | 7 |

| STEP | TOTAL AMOUNT | 21 | 18 | 20 | 17 | 15 | 19 | 16 | 15 | 19 | 16 | 15 | 19 |
|---|---|---|---|---|---|---|---|---|---|---|---|---|---|
| U | Si WAFER SUBSTRATE NUMBER | 3 | 2 | 1 | 6 | 5 | 4 | 9 | 8 | 7 | 12 | 11 | 10 |

| STEP | TOTAL AMOUNT | 21 | 18 | 20 | 17 | 15 | 19 | 16 | 15 | 19 | 20 | 18 | 21 |
|---|---|---|---|---|---|---|---|---|---|---|---|---|---|
| V | Si WAFER SUBSTRATE NUMBER | 6 | 5 | 4 | 9 | 8 | 7 | 12 | 11 | 10 | 1 | 2 | 3 |

| STEP | TOTAL AMOUNT | 21 | 18 | 21 | 17 | 15 | 19 | 20 | 18 | 21 | 20 | 18 | 21 |
|---|---|---|---|---|---|---|---|---|---|---|---|---|---|
| W | Si WAFER SUBSTRATE NUMBER | 9 | 8 | 7 | 12 | 11 | 10 | 1 | 2 | 3 | 4 | 5 | 6 |

| STEP | TOTAL AMOUNT | 21 | 18 | 21 | 21 | 18 | 21 | 20 | 18 | 21 | 21 | 18 | 21 |
|---|---|---|---|---|---|---|---|---|---|---|---|---|---|
| PROCESS COMPLETED | Si WAFER SUBSTRATE NUMBER | 12 | 11 | 10 | 1 | 2 | 3 | 4 | 5 | 6 | 7 | 8 | 9 |

| STEP | TOTAL AMOUNT | 21 | 18 | 21 | 20 | 18 | 21 | 21 | 18 | 21 | 21 | 18 | 21 |
|---|---|---|---|---|---|---|---|---|---|---|---|---|---|
| TAKE OUT Si WAFER SUBSTRATES | Si WAFER SUBSTRATE NUMBER | 1 | 2 | 3 | 4 | 5 | 6 | 7 | 8 | 9 | 12 | 11 | 10 |

FIG. 21

| Si WAFER SUBSTRATE NUMBER | 1 | 2 | 3 | 4 | 5 | 6 | 7 | 8 | 9 | 12 | 11 | 10 |
|---|---|---|---|---|---|---|---|---|---|---|---|---|
| TOTAL AMOUNT | 96 | 72 | 48 | 24 | 0 | 0 | 0 | 0 | 0 | 0 | 0 | 0 |

FIG. 22A

| Si WAFER SUBSTRATE NUMBER | 1 | 2 | 3 | 4 | 5 | 6 | 7 | 8 | 9 | 12 | 11 | 10 |
|---|---|---|---|---|---|---|---|---|---|---|---|---|
| TOTAL AMOUNT | 21 | 18 | 21 | 20 | 18 | 21 | 21 | 18 | 21 | 21 | 18 | 21 |

FIG. 22B

METHOD FOR FABRICATING SEMICONDUCTOR DEVICES

CROSS-REFERENCE TO RELATED APPLICATIONS

This application is based upon and claims the benefits of priority from the prior Japanese Patent Application No. 2006-270708, filed on Oct. 2, 2006, the entire contents of which are incorporated herein by reference.

BACKGROUND (1) Field

This embodiment relates to a method for fabricating semiconductor devices and, more particularly, to a method for efficiently fabricating semiconductor devices.

(2) Description of the Related Art

In recent years ferroelectric memories, such as ferroelectric random access memories (FeRAMs), in which a polarization inversion of a ferroelectric material is used for holding information in a ferroelectric capacitor have been developed. An FeRAM is a nonvolatile memory. That is to say, information held is not lost when power is turned off. FeRAMs are expected to realize high integration levels, high-speed operation, great durability, and low power consumption.

A thin film, such as a $Pb(Zr,Ti)O_3$ (PZT) film or an $SrBi_2Ta_2O_9$ (SBT) film, which has a perovskite crystal structure and in which there is a large amount of residual dielectric polarization is chiefly used as a material for a ferroelectric layer included in a ferroelectric capacitor.

However, it is known that the characteristics of such a ferroelectric layer deteriorate due to water which enters from the outside through an interlayer dielectric. A material, such as a silicon oxide film, which has a high affinity for water is used for forming the interlayer dielectric. Water which enters the interlayer dielectric decomposes into hydrogen and oxygen in a step in which an interlayer dielectric or a metal wiring is formed at a high temperature. Hydrogen reacts with oxygen contained in the ferroelectric layer and oxygen defects are formed in the ferroelectric layer. As a result, the crystallinity of the ferroelectric layer decreases. This is the reason why the characteristics of the ferroelectric layer deteriorate. It is known that using a ferroelectric memory for a long period also causes a deterioration in the crystallinity of the ferroelectric layer. As a result, the amount of residual dielectric polarization in the ferroelectric layer or the dielectric constant of the ferroelectric layer decreases and the performance of the element falls off.

To prevent the deterioration in the performance of the element, an alumina film for preventing water or hydrogen from entering a ferroelectric layer at the time of fabricating a ferroelectric memory is formed in a semiconductor device. For example, in order to prevent water or hydrogen from entering a ferroelectric layer, an alumina film is formed so as to envelop a ferroelectric capacitor (see, for example, Japanese Patent Laid-Open Publication No. 2006-108268). In addition, in order to prevent water or hydrogen from entering a semiconductor element from the top, an alumina film may be formed over a first wiring.

As stated above, a deterioration in the characteristics of the ferroelectric layer is caused by water or hydrogen. In addition, it is known that a deterioration in the characteristics of the ferroelectric layer is caused by plasma chemical vapor deposition (CVD) performed at the time of forming an oxide film, plasma ashing performed at a high temperature for a long time, plasma nitriding, and the formation of a tungsten plug. In this case, the main reason for the deterioration in the characteristics of the ferroelectric layer is that a ferroelectric capacitor is left in an atmosphere of high density plasma.

In order to prevent the deterioration in the characteristics of the ferroelectric layer, a thin film formation method in which the density of plasma is decreased, a thin film formation method in which time for which a ferroelectric capacitor is exposed to an atmosphere of plasma is shortened, or a thin film formation method in which a tungsten plug is formed at a temperature lower than the usual temperature is used. In addition, recovery annealing treatment is performed in order to prevent the deterioration in the characteristics of the ferroelectric layer (see, for example, Japanese Patent Laid-Open Publication No. 2006-100405).

However, even if the measures disclosed above are taken after the formation of the ferroelectric layer, there is variation in the characteristics of ferroelectric capacitors among wafer substrates in the same lot and there is variation in the retention characteristics (data holding functions) of elements among the wafer substrates. The variation in the retention characteristics of the elements among the wafer substrates leads to a decrease in the efficiency of manufacturing semiconductor devices each having a ferroelectric capacitor.

SUMMARY

It is an aspect of the embodiments discussed herein to provide a method for fabricating a semiconductor device, including forming a ferroelectric layer over a plurality of substrates, and rearranging a treatment order of the plurality of substrates, wherein the treatment is a step of the method and is potential step for damaging the ferroelectric layer.

BRIEF DESCRIPTION OF THE DRAWINGS

FIG. 18 is a list of a damage in each step (part 1).

FIG. 19 is a list of a damage in each step (part 2).

FIG. 20 is a view for describing the flow of rearrangement, assignment of integral values, and addition (part 1).

FIG. 21 is a view for describing the flow of rearrangement, assignment of integral values, and addition (part 2).

FIGS. 22A and 22B are views for describing damage distribution, FIG. 22A being a view showing a total amount before damage distribution, FIG. 22B being a view showing a total amount after the damage distribution.

DESCRIPTION OF THE PREFERRED EMBODIMENTS

Embodiments will now be described in detail with reference to the drawings.

Figure 1:
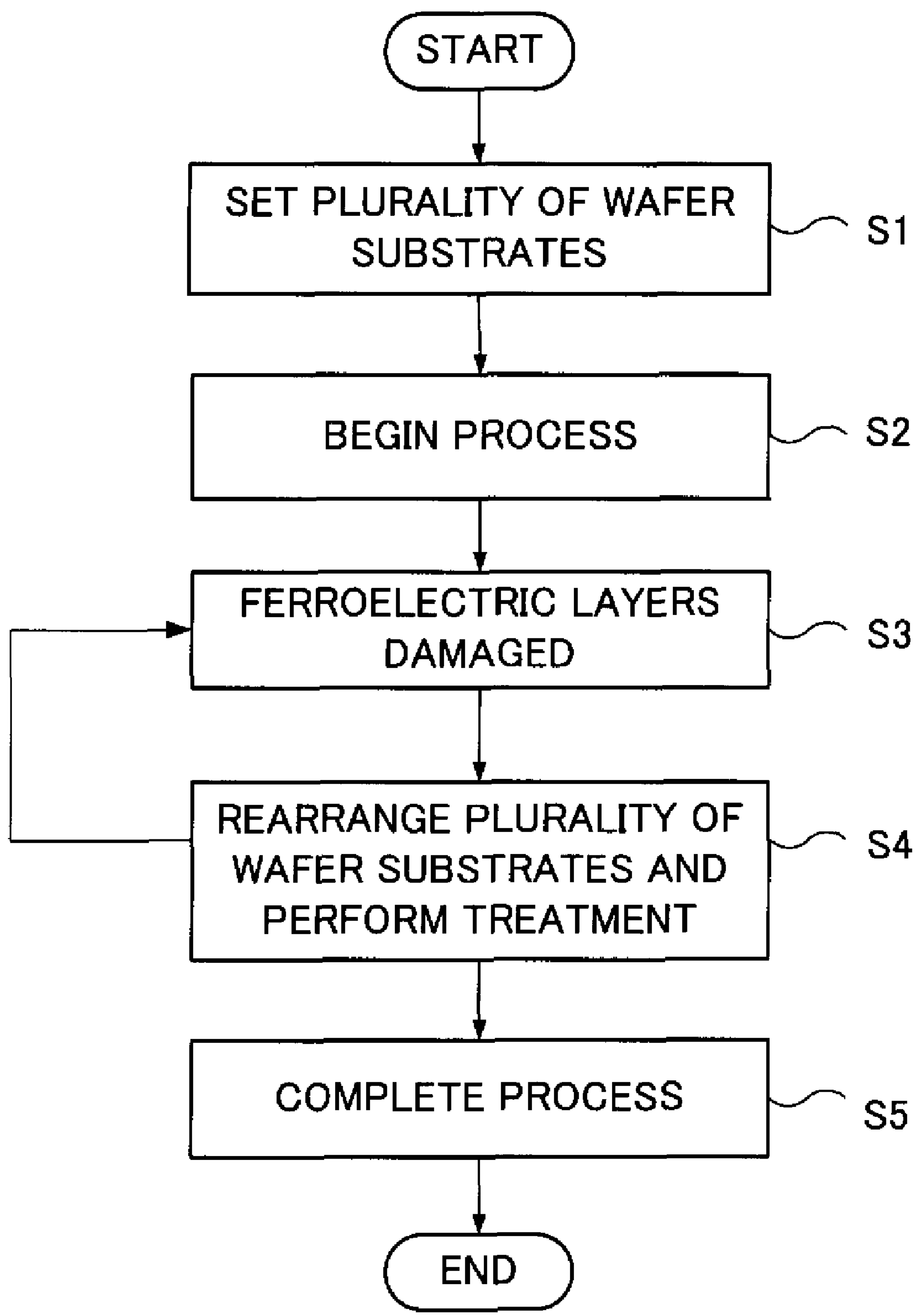
FIG. 1 is a flow chart for describing the principles underlying the rearrangement of wafer substrates.

FIG. 1 is a flow chart for describing the principles underlying the rearrangement of wafer substrates.

A plurality of wafer substrates are set first (step S1). A process for fabricating semiconductor devices each having a ferroelectric capacitor is then begun (step S2).

After ferroelectric layers are formed over the plurality of wafer substrates, the ferroelectric layers formed are damaged (step S3). The plurality of wafer substrates are then rearranged and treatment is performed (step S4). In each step in which the ferroelectric layers formed may be damaged, the plurality of wafer substrates are rearranged and treatment is performed. By doing so, the process is completed (step S5).

If the plurality of wafer substrates are rearranged, damage amounts that correspond to the levels of damages to the ferroelectric layers and that are assigned in advance according to the order in which the plurality of wafer substrates are treated are added each time rearrangement is performed. The damage amounts are integers and change according to the order in which the plurality of wafer substrates are treated.

A concrete method for rearranging wafer substrates will now be described.

First, descriptions will be given with a damage to a ferroelectric layer caused by plasma as an example.

In a process for fabricating an FeRAM, silicon (Si) wafer substrates in the same lot to be treated are rearranged each time a damage to each ferroelectric layer is caused by plasma. By performing this rearrangement, accumulated damages caused by plasma can be distributed among the Si wafer substrates. As a result, the percentage of ferroelectric capacitors which are defective in retention can be decreased.

It is assumed that one lot includes twenty-four Si wafer substrates. After the twenty-four Si wafer substrates are damaged by first plasma treatment, the twenty-four Si wafer substrates that make up one lot are divided into two (first and second) groups before the twenty-four Si wafer substrates are damaged by second and later plasma treatment. The first group is formed by the 1st through 12th Si wafer substrates and the second group is formed by the 13th through 24th Si wafer substrates.

Damage to each Si wafer substrate caused by plasma is as follows.

damage to the 1st Si wafer substrate>damage to the 2nd Si wafer substrate>damage to the 3rd Si wafer substrate>damage to the 4th Si wafer substrate The 5th through 12th Si wafer substrates are not damaged by plasma. Therefore, the Si wafer substrates included in the first group are rearranged in the order of the 4th, 5th, 6th, 7th, 8th, 9th, 10th, 11th, 12th, 3rd, 2nd, and 1st Si wafer substrates and next plasma treatment is performed. The 1st Si wafer substrate is placed at the last position. The reason for this is that a damage to a Si wafer substrate placed at the last position is the lightest in the case of plasma treatment.

A damage to each Si wafer substrate of the second group caused by plasma is as follows.

damage to the 24th Si wafer substrate>damage to the 23rd Si wafer substrate>damage to the 22nd Si wafer substrate The 13th through 21st Si wafer substrates are not damaged by plasma. Therefore, next plasma treatment is performed in the order of the 24th, 23rd, 22nd, 13th, 14th, 15th, 16th, 17th, 18th, 19th, 20th, and 21st Si wafer substrates.

That is to say, after the twenty-four Si wafer substrates are damaged by the first plasma treatment, the twenty-four Si wafer substrates are rearranged in the order of the 4th, 5th, 6th, 7th, 8th, 9th, 10th, 11th, 12th, 3rd, 2nd, 1st, 24th, 23rd, 22nd, 13th, 14th, 15th, 16th, 17th, 18th, 19th, 20th, and 21st Si wafer substrates before the twenty-four Si wafer substrates are damaged by the second and later plasma treatment. The next plasma treatment is then performed.

Before the twenty-four Si wafer substrates are damaged by third and later plasma treatment, the twenty-four Si wafer substrates are rearranged in the same order. The next plasma treatment is then performed.

The above arrangements can be represented by a general formula. It is assumed that the number (greater than or equal to 14) of a plurality of wafer substrates (Si wafer substrates) which make up one lot is n(>13). If the plurality of wafer substrates are rearranged and treatment is performed, the plurality of wafer substrates are divided into two (first and second) groups. If n is an even number, each rearrangement is performed in the following way. Of wafer substrates included in the first group, wafer substrates treated first, second, and third are placed at (n/2)-th through [(n/2)−2]-th positions respectively. Of wafer substrates included in the second group, wafer substrates treated (n−2)-th, (n−1)-th, and nth are placed at [(n/2)+3]-th through [(n/2)+1]-th positions respectively. If n is an odd number, each rearrangement is performed in the following way. Of the wafer substrates included in the first group, the wafer substrates treated first, second, and third are placed at [(n−1)/2]-th through {[(n−1)/2]−2}-th positions respectively. Of the wafer substrates included in the second group, the wafer substrates treated (n−2)-th, (n−1)-th, and n-th are placed at {[(n−1)/2]+3}-th through {[(n−1)/2]+1}-th positions respectively. Alternatively, each rearrangement may be performed in the following way. Of the wafer substrates included in the first group, the wafer substrates treated first, second, and third are placed at [(n+1)/2]-th through {[(n+1)/2]−2}-th positions respectively. Of the wafer substrates included in the second group, the wafer substrates treated (n−2)-th, (n−1)-th, and nth are placed at {[(n+1)/2]+3}-th through {[(n+1)/2]+1}-th positions respectively.

The plurality of wafer substrates may not be divided into two groups. In this case, each rearrangement is performed in the following way. After the Si wafer substrates are damaged by the first plasma treatment, the Si wafer substrates are rearranged in the order of the 4th, 5th, 6th, 7th, 8th, 9th, 10th, 11th, 12th/13th, 14th, 15th, 16th, 17th, 18th, 19th, 20th, 21st, 22nd, 23rd, 24th, 3rd, 2nd, and 1st Si wafer substrates before the Si wafer substrates are damaged by the second and later plasma treatment. The next plasma treatment is then performed. Before the Si wafer substrates are damaged by third and later plasma treatment, the Si wafer substrates are rearranged in the same order. The next plasma treatment is then performed.

One lot may be made up of seven to twelve Si wafer substrates. If one lot is made up of, for example, twelve Si wafer substrates, a damage to each Si wafer substrate caused by plasma is as follows.

damage to the 1st Si wafer substrate>damage to the 2nd Si wafer substrate>damage to the 3rd Si wafer substrate>damage to the 4th Si wafer substrate The 5th through 12th Si wafer substrates are not damaged by plasma. Accordingly, after the Si wafer substrates are damaged by first plasma treatment, the Si wafer substrates are rearranged in the order of the 4th, 5th, 6th, 7th, 8th, 9th, 10th, 11th, 12th, 3rd, 2nd, and 1st Si wafer substrates before the Si wafer substrates are damaged by second and later plasma treatment. The next plasma treatment is then performed. The 1st Si wafer substrate is placed at the last position. The reason for this is that a damage to a Si wafer substrate placed at the last position is the lightest in the case of plasma treatment.

Before the Si wafer substrates are damaged by third and later plasma treatment, the Si wafer substrates are rearranged in the same order. The next plasma treatment is then performed.

One lot may be made up of six Si wafer substrates or less. If one lot is made up of, for example, six Si wafer substrates, a damage to each Si wafer substrate caused by plasma is as follows.

damage to the 1st Si wafer substrate>damage to the 2nd Si wafer substrate>damage to the 3rd Si wafer substrate>damage to the 4th Si wafer substrate The 5th and 6th Si wafer substrates are not damaged by plasma. Accordingly, after the Si wafer substrates are damaged by first plasma treatment, the Si wafer substrates are rearranged in the order of the 4th, 5th, 6th, 3rd, 2nd, and 1st Si wafer substrates before the Si wafer substrates are damaged by second and later plasma treatment. The next plasma treatment is then performed. The 1st Si wafer substrate is placed at the last position. The reason for this is that a damage to a Si wafer substrate placed at the last position is the lightest in the case of plasma treatment.

Before the Si wafer substrates are damaged by third and later plasma treatment, the Si wafer substrates are rearranged in the same order. The next plasma treatment is then performed.

In the above descriptions the number of Si wafer substrates replaced is three. That is to say, the 1st through 3rd Si wafer substrates are replaced. However, the number of Si wafer substrates replaced may be changed. For example, the 1st and 2nd Si wafer substrates (two Si wafer substrates), the 1st through 4th Si wafer substrates (four Si wafer substrates), or the 1st through 5th Si wafer substrates (five Si wafer substrates) may be replaced.

The above arrangements can be represented by a general formula. If the number of wafer substrates is n and the wafer substrates are rearranged, each rearrangement is performed in the following way. Substrates treated first, . . . , and mth (m is smaller than or equal to 5) are placed at nth through [n−(m−1)]th positions respectively. In this case, n is greater than or equal to 3. If n is 3, m is smaller than or equal to 2. If n is 4, m is smaller than or equal to 3. If n is 5, m is smaller than or equal to 4. If n is greater than or equal to 6, m is smaller than or equal to 5.

Each time rearrangement is performed, the levels of damages by plasma are assigned to Si wafer substrates in order of treatment as, for example, integral values. For example, integral values which gradually decrease are assigned to substrates treated first, second, third, and fourth as the amount of a damage by plasma. Si wafer substrates damaged by plasma are rearranged. Each time plasma treatment is performed, an integral value is added. Control is exercised so that the total of integral values (total amount of damages) will not exceed a threshold.

By adopting the above method, damages which occur in the process are distributed among Si wafer substrates included in a lot and the total amount of damages to each ferroelectric layer does not exceed a threshold. That is to say, damages are not accumulated in a ferroelectric layer of a specific Si wafer substrate. As a result, the data holding function of each FeRAM is maintained and variation in retention failure among wafers can be reduced. Accordingly, the total production yield of FeRAMs improves.

A concrete example of rearranging a plurality of Si wafers and reducing damages will now be described with the process for fabricating an FeRAM as an example.

FIGS. 2 through 17 show the process for fabricating an FeRAM, which is a ferroelectric memory, with one of a plurality of Si wafers treated as an example.

Figure 2:
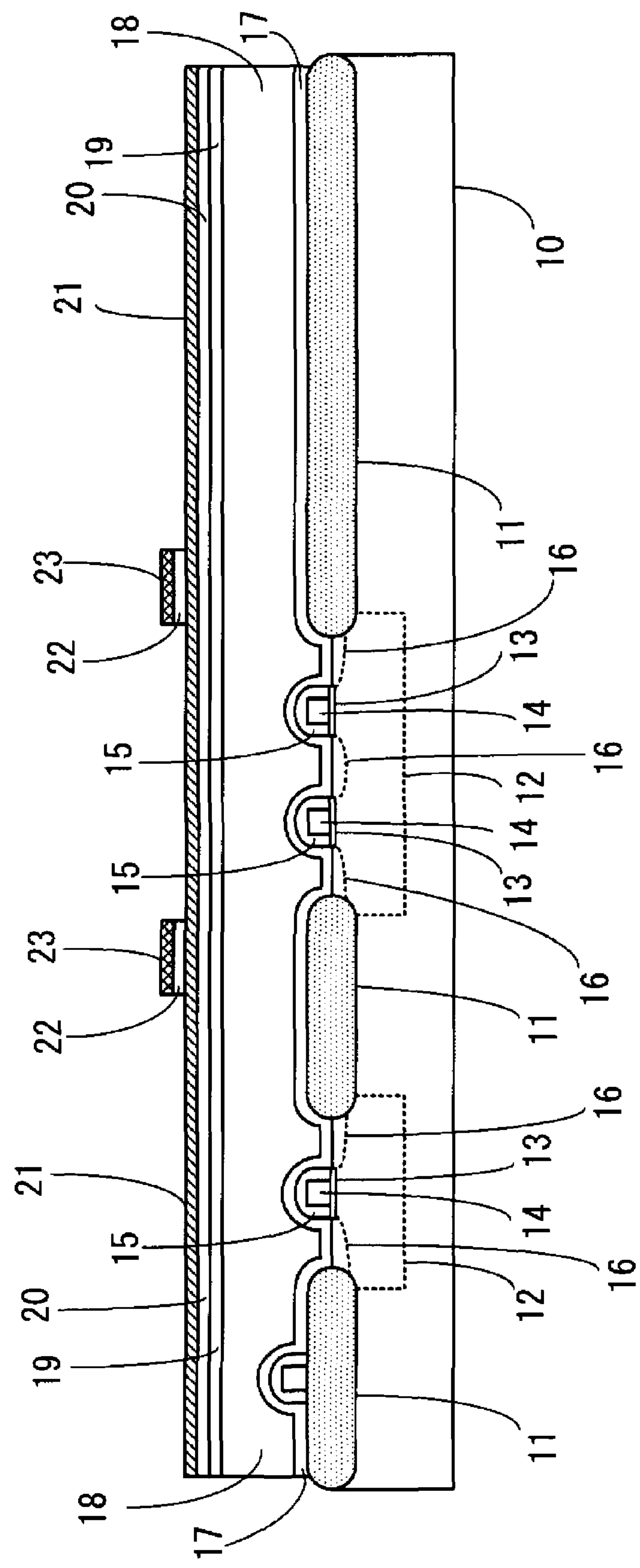
FIG. 2 is a fragmentary sectional view for describing a process for fabricating an FeRAM (part 1).

FIG. 2 is a fragmentary sectional view for describing the process for fabricating an FeRAM.

Isolation regions 11 for defining an element area are formed over a Si wafer substrate 10. Wells 12 are formed in the Si wafer substrate 10. Gate electrodes 14 are formed over the Si wafer substrate 10 in which the wells 12 are formed with a gate insulating film 13 between.

A sidewall insulating film 15 is formed over sidewalls of the gate electrodes 14. Source/drain diffusion layers 16 are formed on both sides of the gate electrodes 14 over which the sidewall insulating film 15 is formed. As a result, transistors each including the gate electrode 14 and the source/drain diffusion layers 16 are formed. In addition, an interlayer dielectric is formed over the Si wafer substrate 10 by a CVD method. For example, a silicon oxide nitride (SiON) film 17 with a thickness of 200 nm is formed as the interlayer dielectric. An interlayer dielectric is formed over the SiON film 17 by the CVD method. For example, a tetraethyl orthosilicate (TEOS)-nondoped silicate glass (NSG) film 18 is formed as the interlayer dielectric.

Chemical mechanical polishing (CMP) is performed to make the thickness of the TEOS-NSG film 18 400 nm. A TEOS-NSG film 19 with a thickness of 100 nm is formed by the CVD method. In order to dehydrate the TEOS-NSG films 18 and 19, dehydration treatment is performed in an atmosphere of nitrogen at a temperature of, for example, 650° C. for about 30 minutes.

An alumina (AlO) film 20 with a thickness of 20 nm is formed over the TEOS-NSG film 19 by, for example, a physical vapor deposition (PVD) method. After the AlO film 20 is formed, RTA treatment is performed in an atmosphere of oxygen at a temperature of, for example, 650° C. for 60 seconds.

A platinum (Pt) film 21 with a thickness of 155 nm is formed over the AlO film 20 by, for example, the PVD method. The Pt film 21 is a lower electrode of each ferroelectric capacitor.

A ferroelectric layer (not shown) is then formed over an entire surface of the Pt film 21 by, for example, the PVD method. For example, a PZT film 22 with a thickness of 150 to 200 nm is formed as the ferroelectric layer. After the PZT film 22 is formed, RTA treatment is performed under the condition that, for example, temperature is 585° C., an oxygen gas flow rate is 0.025 liters/minute, and time is 90 seconds. An $IrO_2$ film 23 with a thickness of 50 nm (not shown) is formed over an entire surface of the PZT film 22 by, for example, the PVD method. After the $IrO_2$ film 23 is formed, RTA treatment is performed under the condition that, for example, temperature is 725° C., an oxygen gas flow rate is 0.025 liters/minute, and time is 20 seconds. The thickness of the $IrO_2$ film 23 is made 200 nm by, for example, the PVD method. In order to form an upper electrode, photoresist is applied, patterning is performed, and the $IrO_2$ film 23 is etched. At this time the ferroelectric layer is damaged by plasma. Accordingly, integral values are assigned according to the order in which Si wafer substrates are treated. After the etching is performed, the Si wafer substrates are rearranged in the lot. The next treatment is then performed.

The $IrO_2$ film 23 on which the patterning has been performed is formed over the PZT film 22. This $IrO_2$ film 23 is the upper electrode of each ferroelectric capacitor.

In order to perform recovery anneal on the PZT film 22, heat treatment is then performed by the use of a vertical type furnace under the condition that, for example, temperature is 650° C., an oxygen gas flow rate is 20 liters/minute, and time is 60 minutes.

In order to form each ferroelectric capacitor, photoresist is applied to an entire surface of the substrate, patterning is performed, and the PZT film 22 is etched (not shown). At this time the ferroelectric layer is damaged by plasma. Accordingly, integral values are assigned according to the order in which the Si wafer substrates are treated. After the etching is performed, the Si wafer substrates are rearranged in the lot. The next treatment is then performed.

In order to perform recovery anneal on the PZT film 22, heat treatment is performed by the use of the vertical type furnace under the condition that, for example, temperature is 350° C., an oxygen gas flow rate is 20 liters/minute, and time is 60 minutes. In order to protect the PZT film 22, an AlO film with a thickness of 50 nm (not shown) is then formed over an entire surface of the substrate by, for example, the PVD method. After the AlO film is formed, heat treatment is performed by the use of the vertical type furnace under the condition that, for example, temperature is 550° C., an oxygen gas flow rate is 20 liters/minute, and time is 60 minutes.

Figure 3:
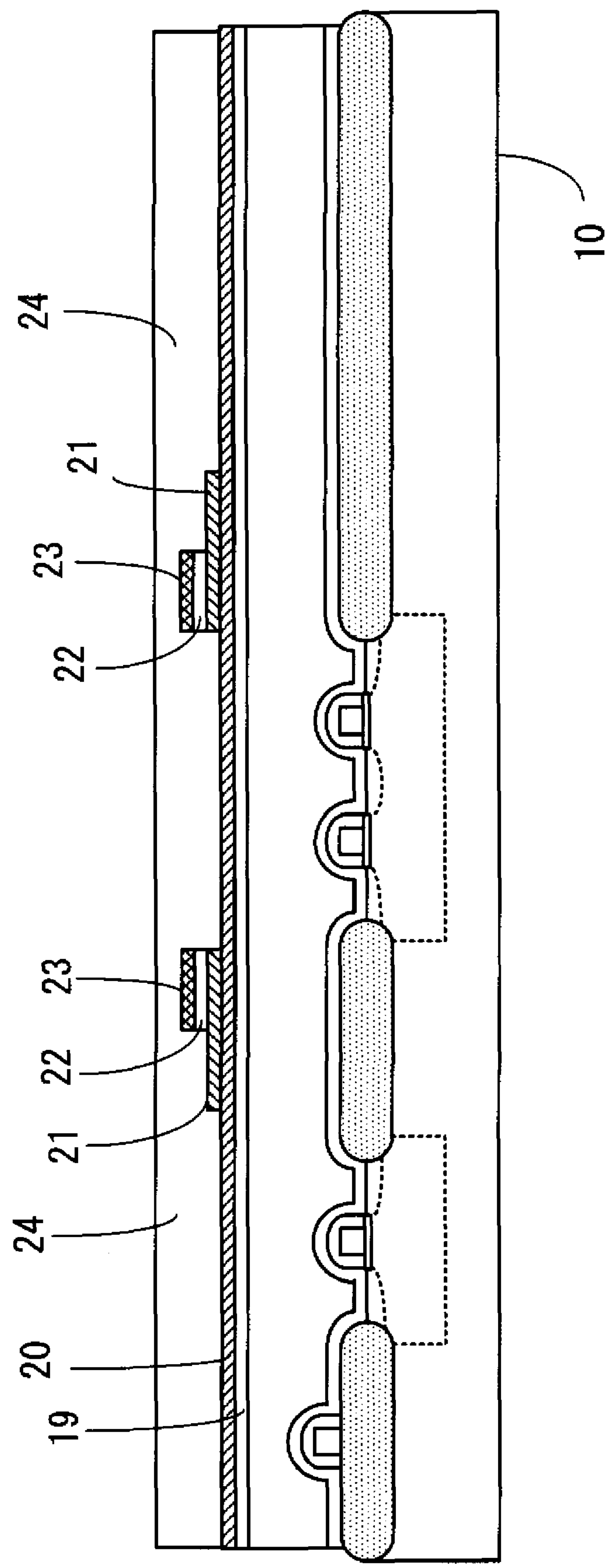
FIG. 3 is a fragmentary sectional view for describing the process for fabricating the FeRAM (part 2).

FIG. 3 is a fragmentary sectional view for describing the process for fabricating the FeRAM.

In order to form the lower electrode, photoresist is applied to an entire surface of the substrate, patterning is performed, and the Pt film 21 shown in FIG. 2 is etched (not shown). By doing so, patterning is performed on the Pt film 21. At this time the ferroelectric layer is damaged by plasma. Accordingly, integral values are assigned according to the order in which the Si wafer substrates are treated. After the etching is performed, the Si wafer substrates are rearranged in the lot. The next treatment is then performed.

In order to perform recovery anneal on the PZT film 22, heat treatment is performed by the use of the vertical type furnace under the condition that, for example, temperature is 650° C., an oxygen gas flow rate is 20 liters/minute, and time is 60 minutes. In order to protect each ferroelectric capacitor, an AlO film with a thickness of 20 nm (not shown) is then formed over an entire surface of the substrate by, for example, the PVD method. After the AlO film is formed, heat treatment is performed by the use of the vertical type furnace under the condition that, for example, temperature is 550° C., an oxygen gas flow rate is 20 liters/minute, and time is 60 minutes.

A TEOS-NSG film 24 with a thickness of 1,500 nm is formed by, for example, the PVD method so as to completely cover each ferroelectric capacitor. At this time the ferroelectric layer is damaged by bias. Accordingly, integral values are assigned according to the order in which the Si wafer substrates are treated. After the TEOS-NSG film 24 is formed, the Si wafer substrates are rearranged in the lot. The next treatment is then performed. After the TEOS-NSG film 24 is formed, the surface is planarized by performing the CMP (not shown).

Figure 4:
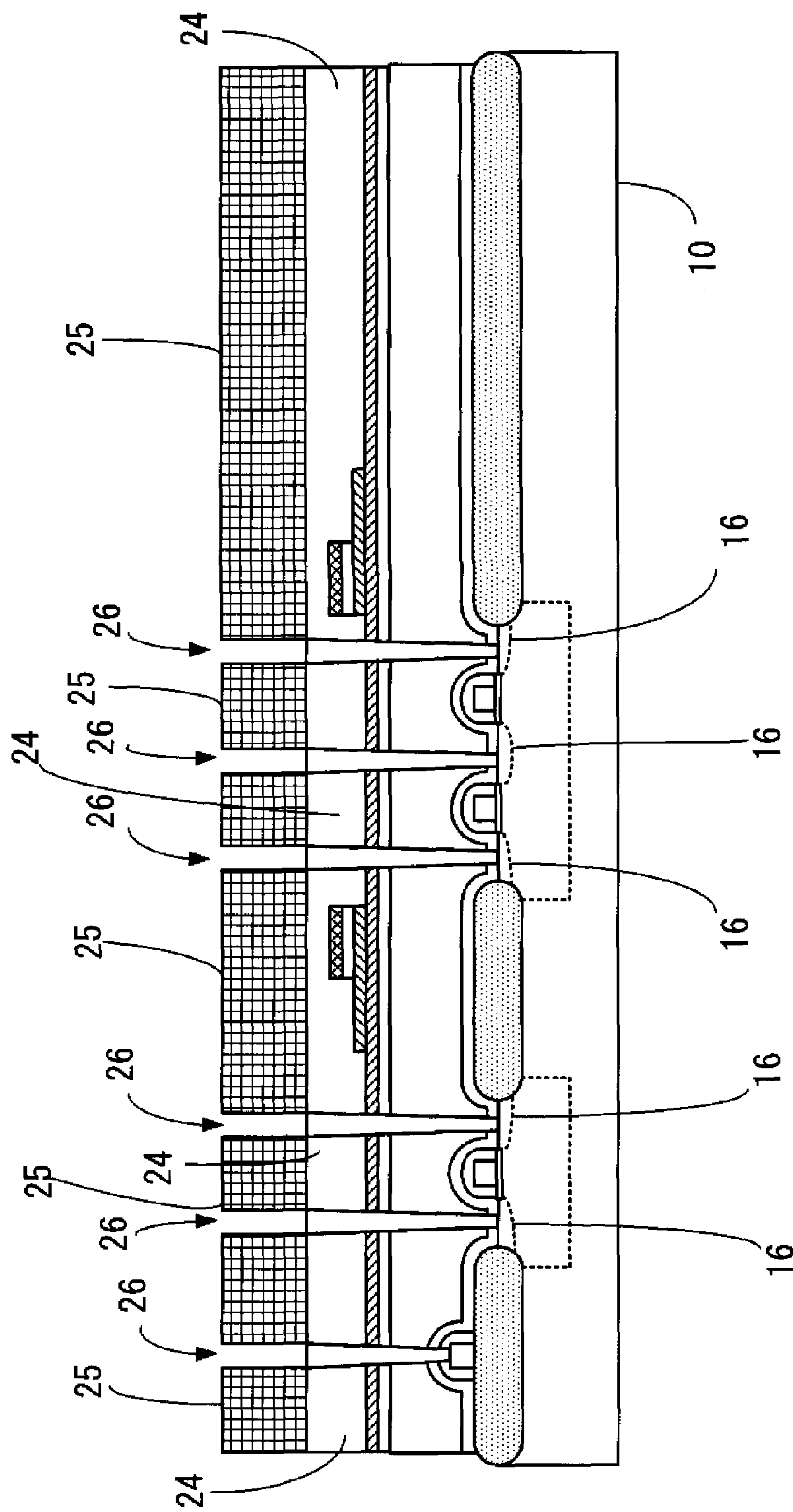
FIG. 4 is a fragmentary sectional view for describing the process for fabricating the FeRAM (part 3).

FIG. 4 is a fragmentary sectional view for describing the process for fabricating the FeRAM.

In order to nitride the surface of the TEOS-NSG film 24 (not shown), plasma anneal is performed at a temperature of 350° C. for 2 minutes by the use of, for example, a CVD system. In this case, nitrogen gas and oxygen gas are used for generating plasma.

At this time the ferroelectric layer is damaged by plasma and heat. Accordingly, integral values are assigned according to the order in which the Si wafer substrates are treated. After the plasma anneal is performed, the Si wafer substrates are rearranged in the lot. The next treatment is then performed.

In order to form each bulk contact, photoresist 25 is applied, patterning is performed, and etching is performed. By doing so, a portion between the surface of the substrate and the source/drain diffusion layer 16 is removed and a contact hole 26 is formed. At this time the ferroelectric layer is damaged by plasma. Accordingly, integral values are assigned according to the order in which the Si wafer substrates are treated. After the etching is performed, the Si wafer substrates are rearranged in the lot. The next treatment is then performed.

Figure 5:
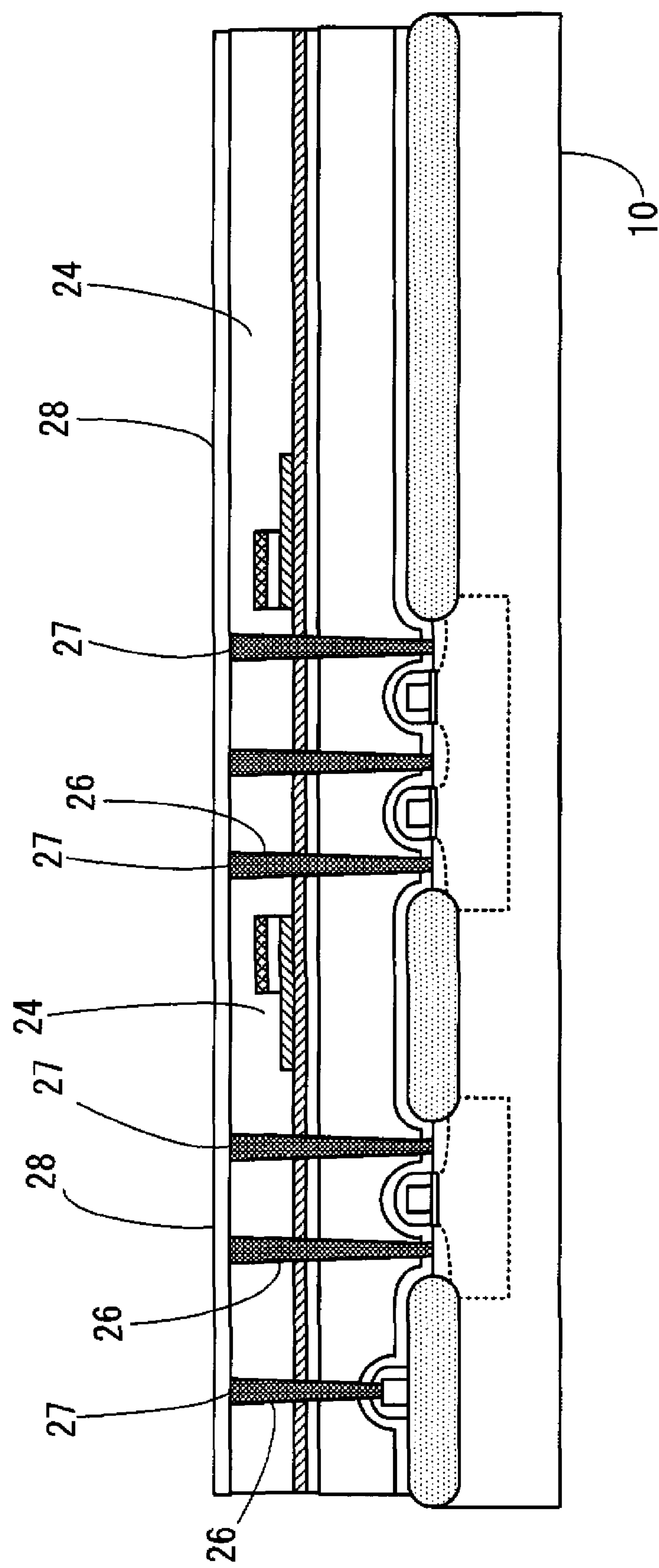
FIG. 5 is a fragmentary sectional view for describing the process for fabricating the FeRAM (part 4).

FIG. 5 is a fragmentary sectional view for describing the process for fabricating the FeRAM.

In order to form barrier metal film (not shown) in the contact hole 26, a Ti film with a thickness of 20 nm and a TiN film with a thickness of 50 nm are formed over an entire surface of the substrate by, for example, the PVD method. After the barrier metal film is formed, a tungsten (W) film 27 with a thickness of 500 nm is formed is formed by, for example, the CVD method. In order to remove the W film 27 except in the contact hole 26, the W film 27 is polished by performing, for example, the CMP. By doing so, the W film 27 which is a contact plug is formed.

In order to nitride the surface of the TEOS-NSG film 24, plasma anneal is performed at a temperature of 350° C. for 2 minutes by the use of, for example, the CVD system. In this case, nitrogen gas and oxygen gas are used for generating plasma.

The ferroelectric layer is damaged by heat at the time of forming the Ti film and the TiN film, forming the W film by the CVD method, and performing the plasma anneal. In addition, the ferroelectric layer is damaged by plasma at the time of performing the plasma anneal. Accordingly, in these steps integral values are assigned according to the order in which the Si wafer substrates are treated. After each step is completed, the Si wafer substrates are rearranged in the lot. The next treatment is then performed.

An SiON film 28 with a thickness of 100 nm is formed over the TEOS-NSG film 24 by, for example, the CVD method.

Figure 6:
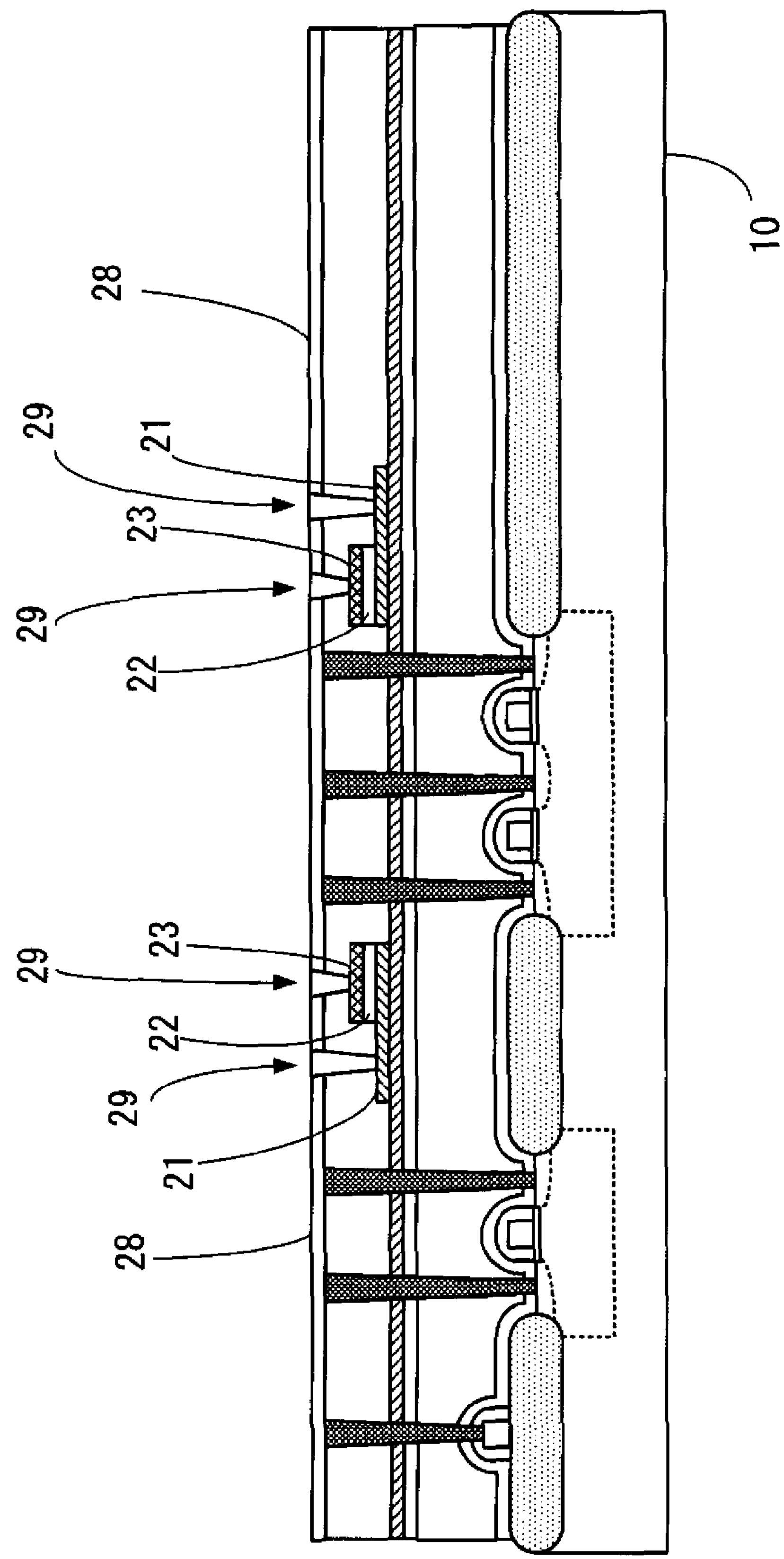
FIG. 6 is a fragmentary sectional view for describing the process for fabricating the FeRAM (part 5).

FIG. 6 is a fragmentary sectional view for describing the process for fabricating the FeRAM.

In order to form a contact of the $IrO_2$ film 23 which is the upper electrode and a contact of the Pt film 21 which is the lower electrode, photoresist is applied to the SiON film 28, patterning is performed, and etching is performed with the photoresist as a mask. By doing so, contact holes 29 are formed. At this time the ferroelectric layer is damaged by plasma. Accordingly, integral values are assigned according to the order in which the Si wafer substrates are treated. After the etching is performed, the Si wafer substrates are rearranged in the lot. The next treatment is then performed.

In order to perform recovery anneal on the PZT film 22, heat treatment is performed by the use of the vertical type furnace under the condition that, for example, temperature is 500° C., an oxygen gas flow rate is 20 liters/minute, and time is 60 minutes.

Figure 7:
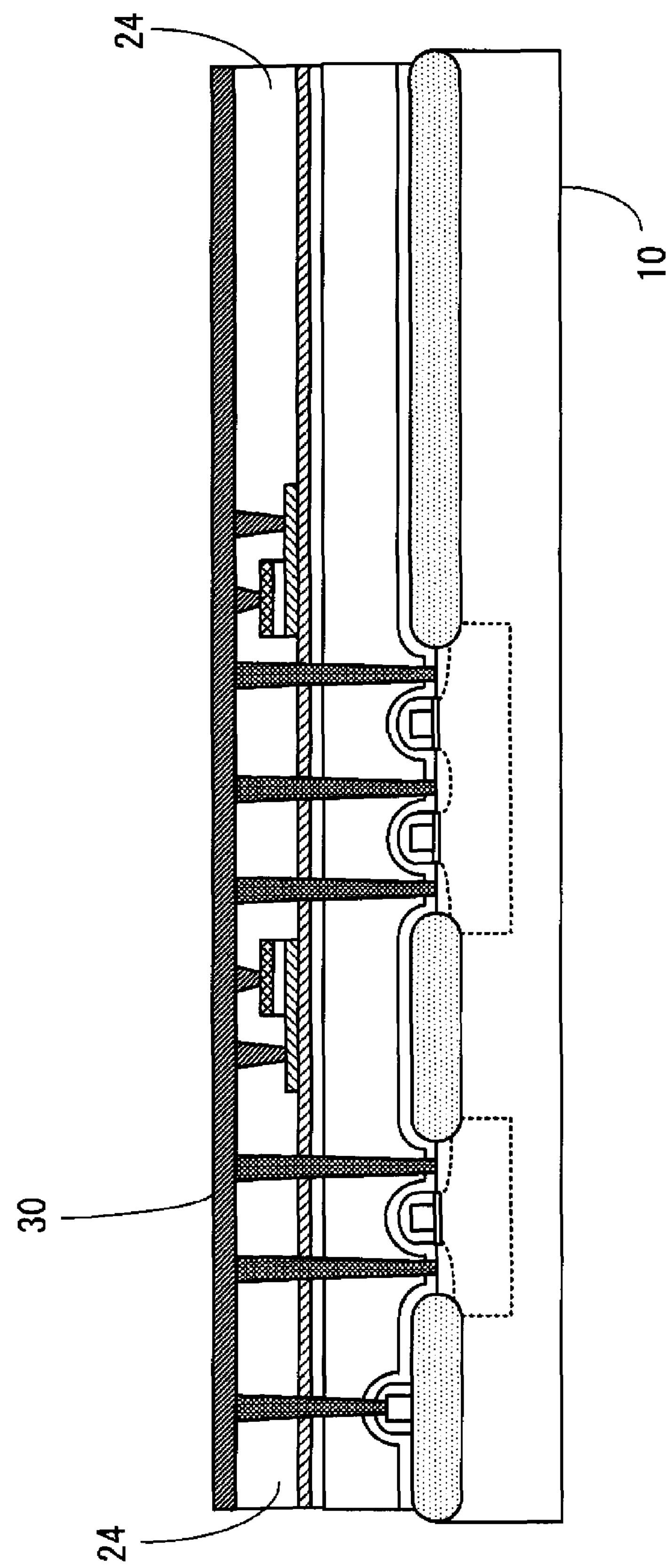
FIG. 7 is a fragmentary sectional view for describing the process for fabricating the FeRAM (part 6).

FIG. 7 is a fragmentary sectional view for describing the process for fabricating the FeRAM.

In order to remove the SiON film 28 shown in FIG. 6, an etch-back is performed (not shown). By doing so, all of the SiON film 28 is removed and the TEOS-NSG film 24 gets exposed. In order to form a first wiring layer, a laminated film 30 made up of a TiN film with a thickness of 150 nm, an AlCu film with a thickness of 550 nm, a Ti film with a thickness of 5 nm, and a TiN film with a thickness of 150 nm is formed by, for example, the PVD method. The laminated film 30 is the first wiring layer.

The ferroelectric layer is damaged by plasma at the time of performing the etch-back. In addition, the ferroelectric layer is damaged by heat at the time of forming the laminated film 30. Accordingly, in these steps integral values are assigned according to the order in which the Si wafer substrates are treated. After each step is completed, the Si wafer substrates are rearranged in the lot. The next treatment is then performed.

Figure 8:
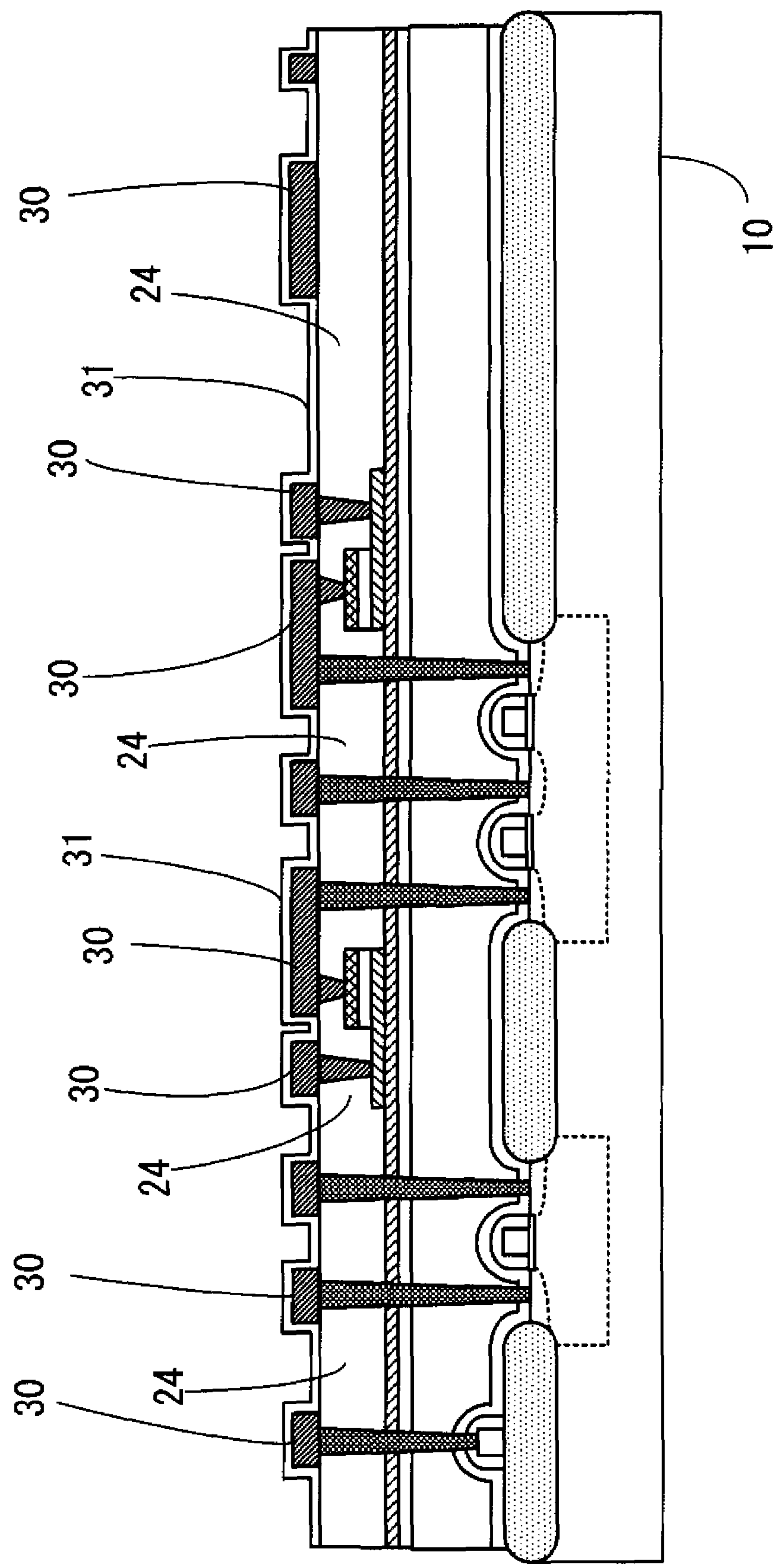
FIG. 8 is a fragmentary sectional view for describing the process for fabricating the FeRAM (part 7).

FIG. 8 is a fragmentary sectional view for describing the process for fabricating the FeRAM.

In order to perform patterning on the laminated film 30 which is the first wiring layer, photoresist is applied, patterning is performed, and the laminated film 30 is etched with the photoresist as a mask. After the patterning is performed, heat treatment is performed by the use of the vertical type furnace under the condition that, for example, temperature is 350° C., a nitrogen gas flow rate is 20 liters/minute, and time is 30 minutes.

The ferroelectric layer is damaged by plasma at the time of performing the etching. In addition, the ferroelectric layer is damaged by heat at the time of performing the heat treatment. Accordingly, in these steps integral values are assigned according to the order in which the Si wafer substrates are treated. After each step is completed, the Si wafer substrates are rearranged in the lot. The next treatment is then performed.

An AlO film 31 with a thickness of 20 nm is formed over the laminated film 30 and the TEOS-NSG film 24 by, for example, the PVD method.

Figure 9:
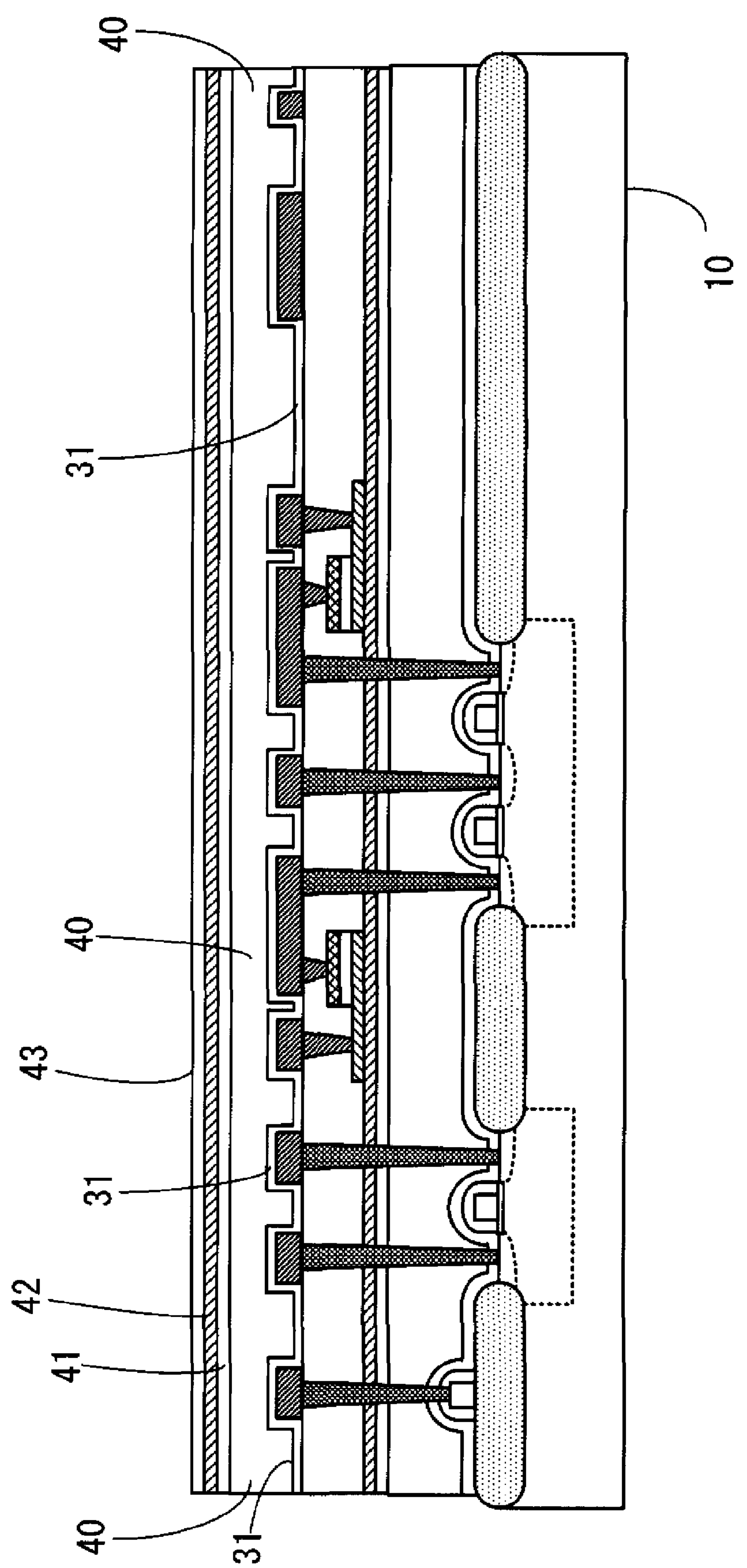
FIG. 9 is a fragmentary sectional view for describing the process for fabricating the FeRAM (part 8).

FIG. 9 is a fragmentary sectional view for describing the process for fabricating the FeRAM.

A TEOS-NSG film 40 with a thickness of 2,600 nm (not shown) is formed over the AlO film 31 by, for example, the CVD method. In order to perform planarization, the TEOS-NSG film 40 is polished by performing, for example, the CMP. As a result, the surface of the TEOS-NSG film 40 is planarized.

In order to nitride the surface of the TEOS-NSG film 40 (not shown), plasma anneal is performed at a temperature of 350° C. for 4 minutes by the use of, for example, the CVD system. In this case, nitrogen gas and oxygen gas are used for generating plasma. A TEOS-NSG film 41 with a thickness of 100 nm is formed over the TEOS-NSG film 40 by, for example, the CVD method. Plasma anneal is then performed under the same condition.

An AlO film 42 with a thickness of 50 nm is formed over the TEOS-NSG film 41 by, for example, the PVD method.

A TEOS-NSG film 43 with a thickness of 100 nm is formed over the AlO film 42 by, for example, the CVD method.

In order to nitride the surface of the TEOS-NSG film 43, plasma anneal is performed at a temperature of 350° C. for 2 minutes by the use of, for example, the CVD system. In this case, nitrogen gas and oxygen gas are used for generating plasma. The ferroelectric layer is damaged by bias at the time of forming the TEOS-NSG films 40, 41, and 43 by the CVD method. In addition, the ferroelectric layer is damaged by plasma and heat at the time of performing the plasma anneal. Accordingly, in these steps integral values are assigned according to the order in which the Si wafer substrates are treated. After each step is completed, the Si wafer substrates are rearranged in the lot. The next treatment is then performed.

Figure 10:
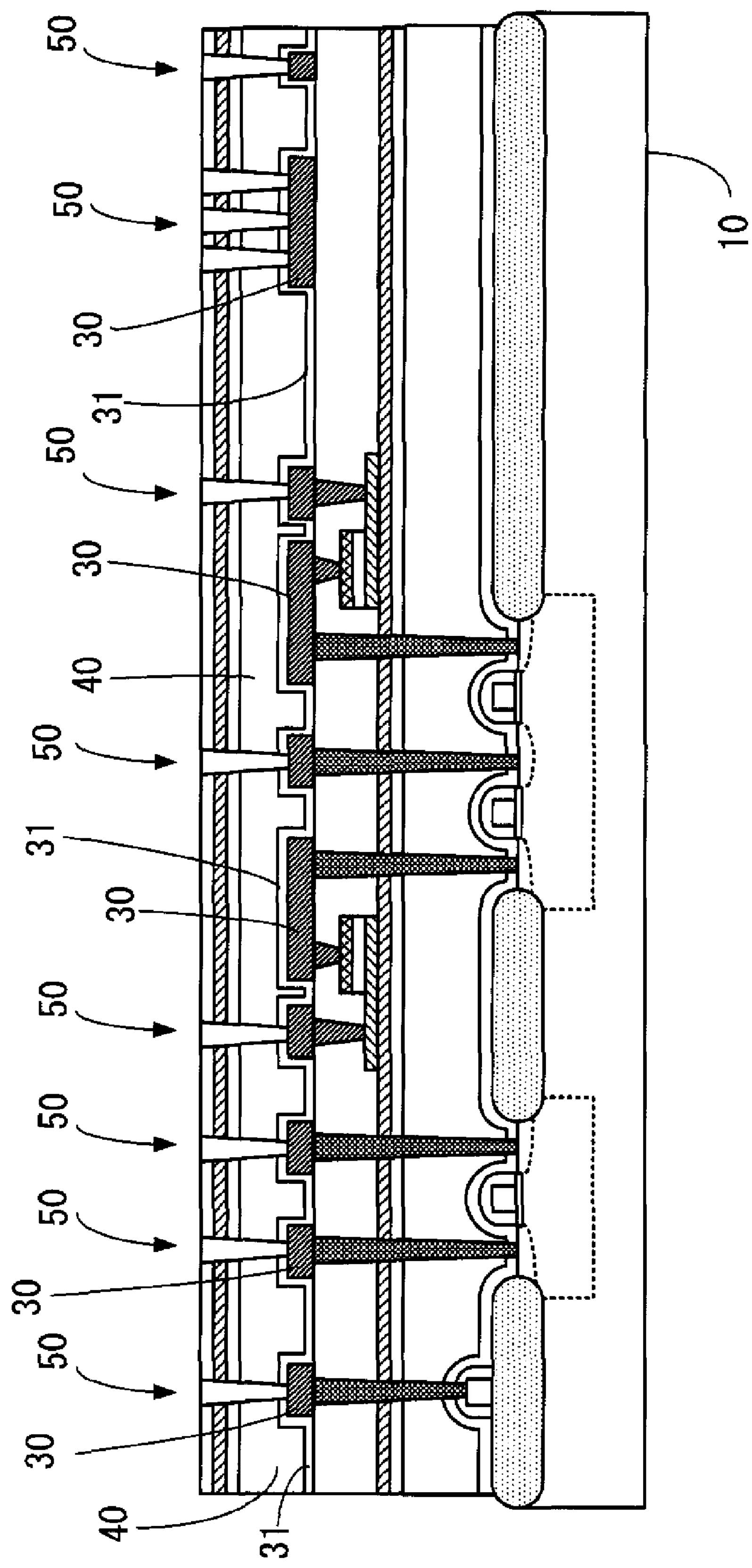
FIG. 10 is a fragmentary sectional view for describing the process for fabricating the FeRAM (part 9).

FIG. 10 is a fragmentary sectional view for describing the process for fabricating the FeRAM.

In order to form contact holes 50 for electrically connecting the laminated film 30, which is the first wiring layer, and a second wiring layer, photoresist is applied and patterning is performed on the photoresist (not shown).

Etching, for example, is performed with the photoresist as a mask. By doing so, the TEOS-NSG films 40, 41, and 43 and the AlO films 31 and 42 shown in FIG. 9 are etched and the contact holes 50 are formed.

Heat treatment is then performed by the use of the vertical type furnace under the condition that temperature is 350° C., a nitrogen gas flow rate is 20 liters/minute, and time is 120 minutes.

The ferroelectric layer is damaged by plasma at the time of performing the etching. In addition, the ferroelectric layer is damaged by heat at the time of performing the heat treatment. Accordingly, in these steps integral values are assigned according to the order in which the Si wafer substrates are treated. After each step is completed, the Si wafer substrates are rearranged in the lot. The next treatment is then performed.

Figure 11:
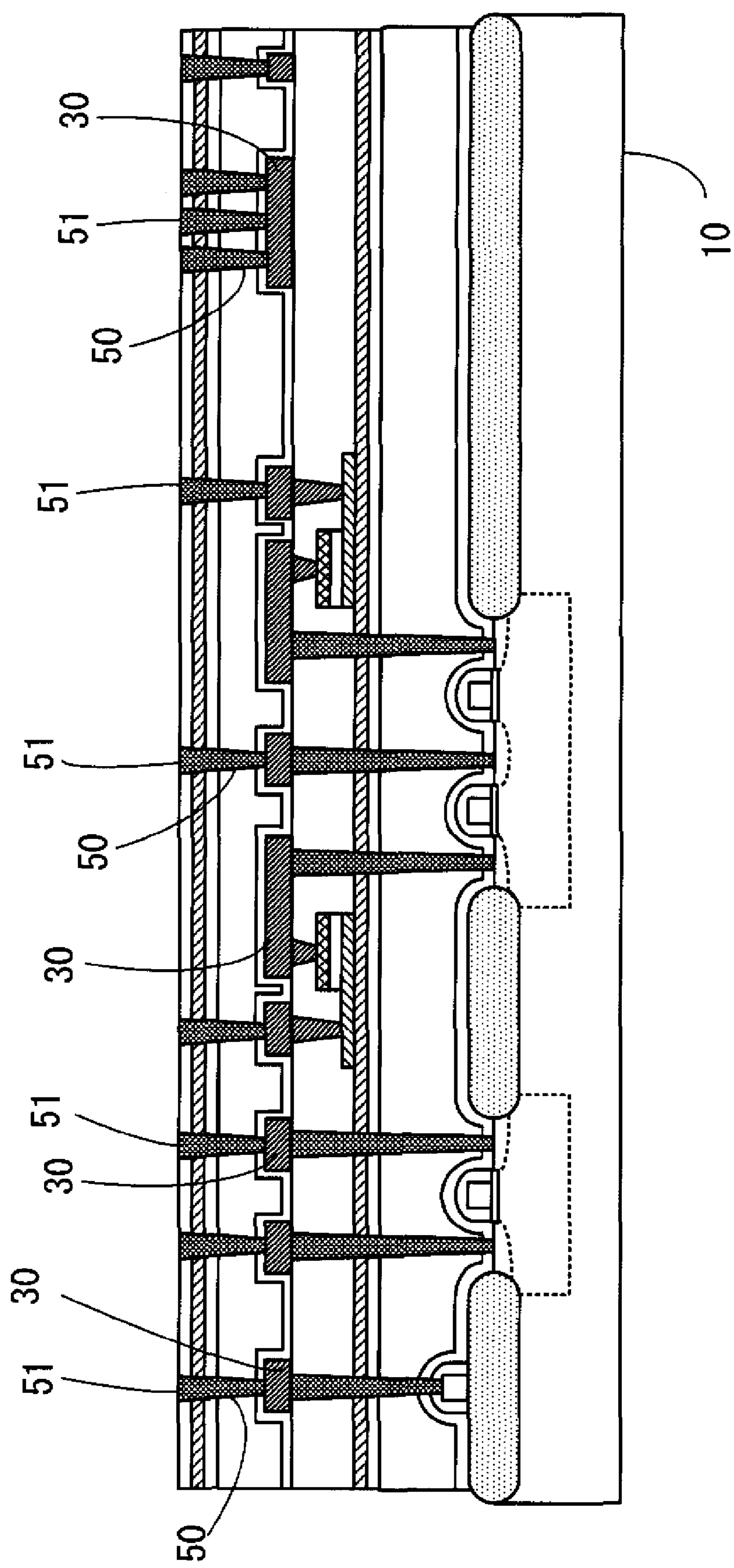
FIG. 11 is a fragmentary sectional view for describing the process for fabricating the FeRAM (part 10).

FIG. 11 is a fragmentary sectional view for describing the process for fabricating the FeRAM.

In order to form contact plugs for electrically connecting the laminated film 30, which is the first wiring layer, and the second wiring layer, a barrier metal film (not shown) is formed in the contact holes 50 and over the surface of the substrate. For example, a TiN film with a thickness of 50 nm is formed by the PVD method.

A W film with a thickness of 650 nm (not shown) is formed over the TiN film by, for example, the CVD method. In order to form the contact plugs, etching, for example, is then performed. That is to say, the W film is removed by an etch-back. By doing so, a W film 51 is formed in the contact holes 50. In this case, the CMP may be performed in place of the etch-back.

The ferroelectric layer is damaged by heat at the time of forming the TiN film and the W film. In addition, the ferroelectric layer is damaged by plasma at the time of performing the etch-back. Accordingly, in these steps integral values are assigned according to the order in which the Si wafer substrates are treated. After each step is completed, the Si wafer substrates are rearranged in the lot. The next treatment is then performed.

Figure 12:
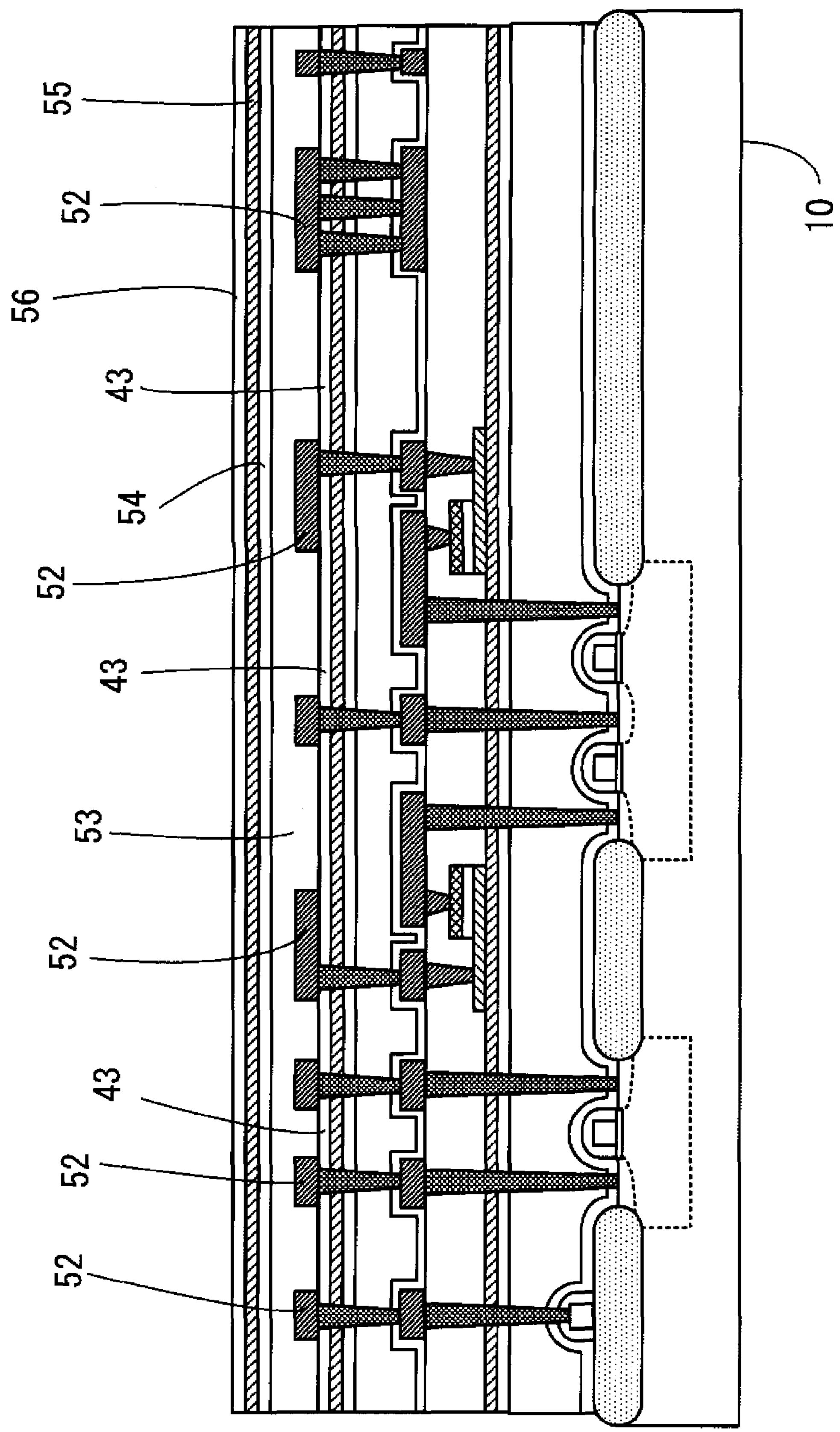
FIG. 12 is a fragmentary sectional view for describing the process for fabricating the FeRAM (part 11).

FIG. 12 is a fragmentary sectional view for describing the process for fabricating the FeRAM.

In order to form the second wiring layer (not shown), a laminated film 52 made up of an AlCu film with a thickness of 550 nm, a Ti film with a thickness of 5 nm, and a TiN film with a thickness of 150 nm is formed over the substrate by, for example, the PVD method.

In order to perform patterning on the laminated film 52, photoresist is applied, patterning is performed on the photoresist, and the laminated film 52 is etched with the photoresist as a mask. As a result, patterning is performed on the laminated film 52 and the second wiring layer is formed.

A TEOS-NSG film 53 with a thickness of 2,200 nm is formed over the laminated film 52 and the TEOS-NSG film 43 by, for example, the CVD method. The surface of the TEOS-NSG film 53 is planarized by performing, for example, the CMP.

In order to nitride the surface of the TEOS-NSG film 53 (not shown), plasma anneal is performed at a temperature of 350° C. for 4 minutes by the use of, for example, the CVD system. In this case, nitrogen gas and oxygen gas are used for generating plasma.

A TEOS-NSG film 54 with a thickness of 100 nm is formed over the TEOS-NSG film 53 by, for example, the CVD method. In order to nitride the surface of the TEOS-NSG film 54, plasma anneal is then performed at a temperature of 350° C. for 2 minutes by the use of, for example, the CVD system. In this case, nitrogen gas and oxygen gas are used for generating plasma.

An AlO film 55 with a thickness of 50 nm is then formed over the TEOS-NSG film 54 by, for example, the PVD method. A TEOS-NSG film 56 with a thickness of 100 nm is formed over the AlO film 55 by, for example, the CVD method. In order to nitride the surface of the TEOS-NSG film 56, plasma anneal is performed at a temperature of 350° C. for 2 minutes by the use of, for example, the CVD system. In this case, nitrogen gas and oxygen gas are used for generating plasma.

The ferroelectric layer is damaged by heat at the time of forming the laminated film 52 with the CVD method. In addition, the ferroelectric layer is damaged by plasma at the time of etching the laminated film 52. The ferroelectric layer is damaged by bias at the time of forming the TEOS-NSG films 53, 54, and 56 by the CVD method. In addition, the ferroelectric layer is damaged by plasma and heat at the time of nitriding the surfaces of the TEOS-NSG films 53, 54, and 56. Accordingly, in these steps integral values are assigned according to the order in which the Si wafer substrates are treated. After each step is completed, the Si wafer substrates are rearranged in the lot. The next treatment is then performed.

Figure 13:
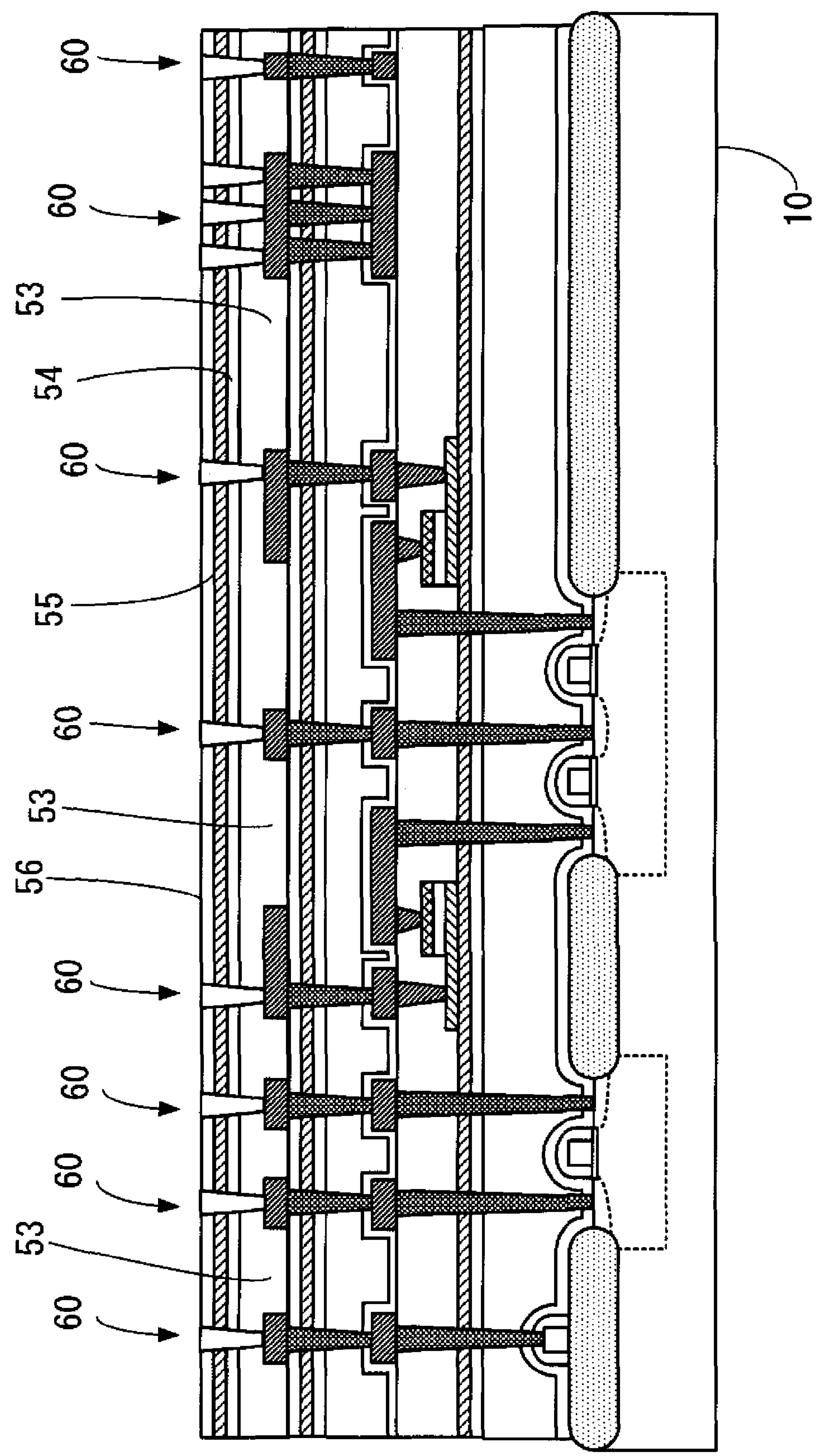
FIG. 13 is a fragmentary sectional view for describing the process for fabricating the FeRAM (part 12).

FIG. 13 is a fragmentary sectional view for describing the process for fabricating the FeRAM.

In order to form contact holes 60 for electrically connecting the laminated film 52, which is the second wiring layer, and a third wiring layer, photoresist is applied, patterning is performed on the photoresist, and etching, for example, is performed (not shown). That is to say, the TEOS-NSG films 53, 54, and 56 and the AlO film 55 are etched with the photoresist as a mask.

Heat treatment is then performed by the use of the vertical type furnace under the condition that temperature is 350° C., a nitrogen gas flow rate is 20 liters/minute, and time is 120 minutes.

The ferroelectric layer is damaged by plasma at the time of performing the etching. In addition, the ferroelectric layer is damaged by heat at the time of performing the heat treatment. Accordingly, in these steps integral values are assigned according to the order in which the Si wafer substrates are treated. After each step is completed, the Si wafer substrates are rearranged in the lot. The next treatment is then performed.

Figure 14:
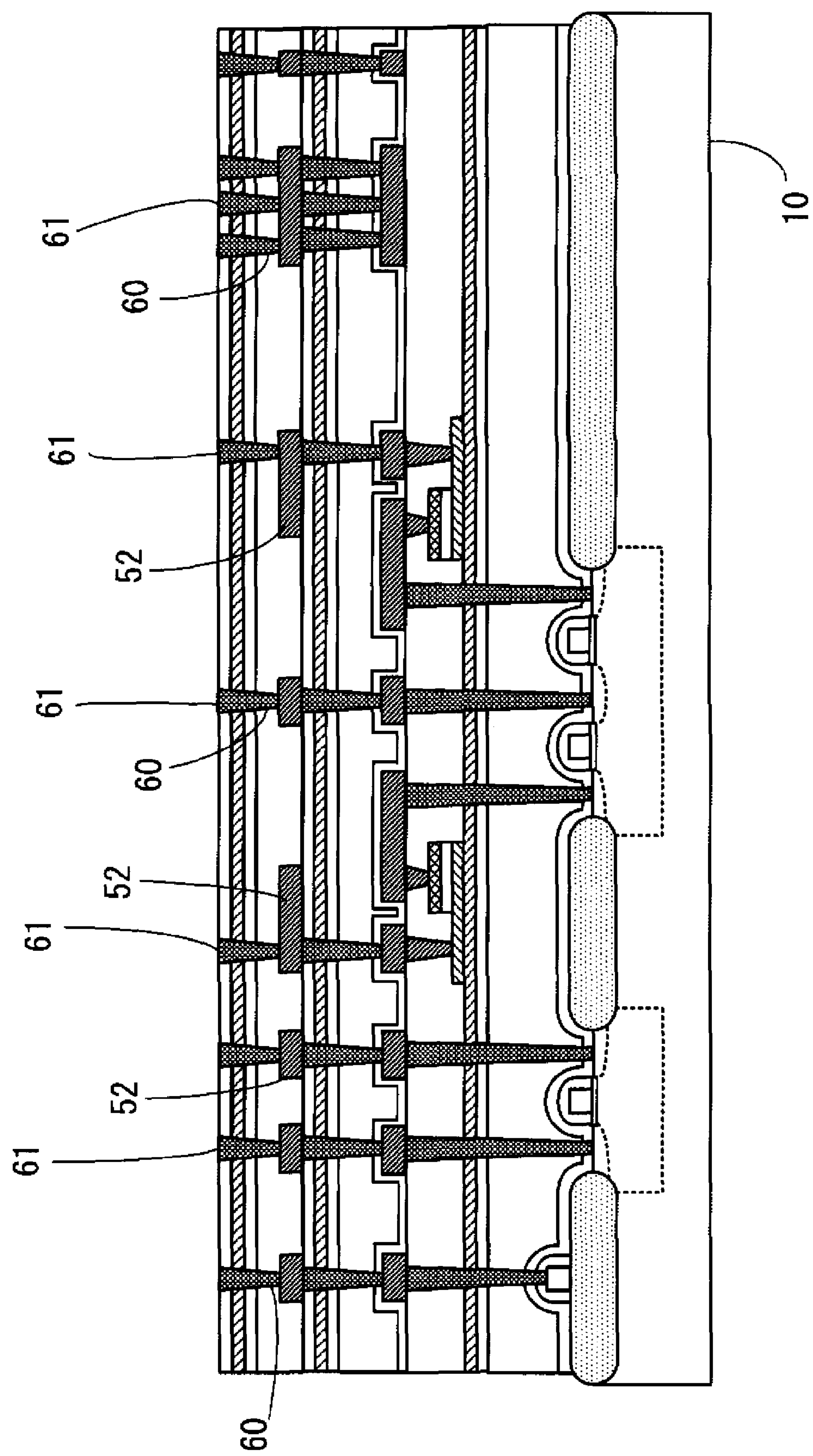
FIG. 14 is a fragmentary sectional view for describing the process for fabricating the FeRAM (part 13).

FIG. 14 is a fragmentary sectional view for describing the process for fabricating the FeRAM.

In order to form a barrier metal film (not shown) in each contact hole 60, a TiN film with a thickness of 50 nm is formed by, for example, the PVD method.

In order to form contact plugs for electrically connecting the laminated film 52, which is the second wiring layer, and the third wiring layer, a W film with a thickness of 650 nm (not shown) is formed over the TiN film by, for example, the CVD method. In order to form the contact plugs, etching, for example, is then performed. That is to say, the W film is removed by an etch-back. By doing so, a W film 61 is formed in the contact holes 60. In this case, the CMP may be performed in place of the etch-back.

The ferroelectric layer is damaged by heat at the time of forming the TiN film and the W film. In addition, the ferroelectric layer is damaged by plasma at the time of performing the etch-back. Accordingly, in these steps integral values are assigned according to the order in which the Si wafer substrates are treated. After each step is completed, the Si wafer substrates are rearranged in the lot. The next treatment is then performed.

Figure 15:
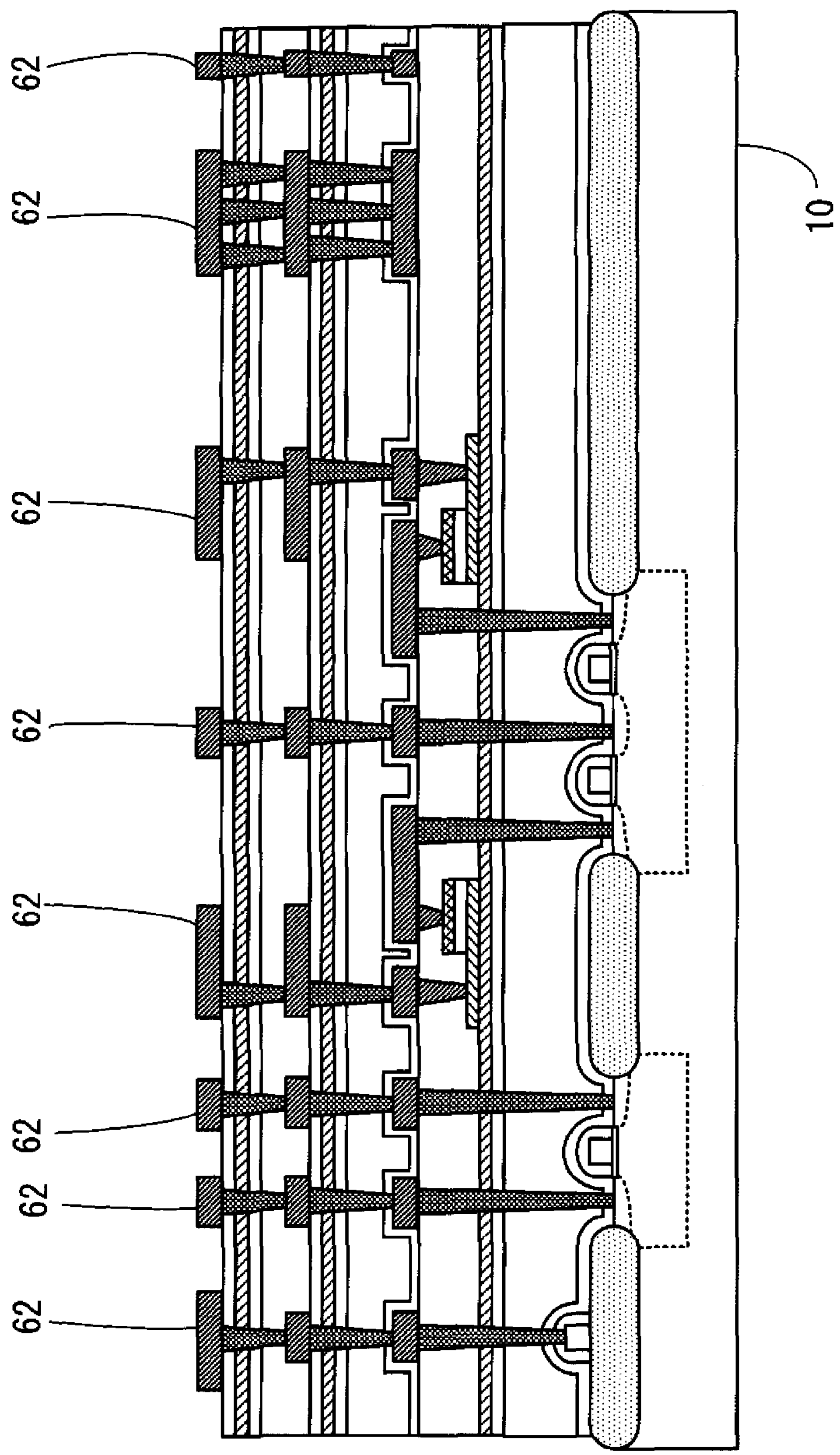
FIG. 15 is a fragmentary sectional view for describing the process for fabricating the FeRAM (part 14).

FIG. 15 is a fragmentary sectional view for describing the process for fabricating the FeRAM.

In order to form the third wiring layer, a laminated film 62 made up of an AlCu film with a thickness of 500 nm and a TiN film with a thickness of 150 nm is formed by, for example, the PVD method. Photoresist is applied, patterning is performed on the photoresist, and the laminated film 62 is etched with the photoresist as a mask. As a result, patterning is performed on the laminated film 62 and the third wiring layer is formed. The ferroelectric layer is damaged by heat at the time of forming the laminated film 62. In addition, the ferroelectric layer is damaged by plasma at the time of etching the laminated film 62. Accordingly, in these steps integral values are assigned according to the order in which the Si wafer substrates are treated. After each step is completed, the Si wafer substrates are rearranged in the lot. The next treatment is then performed.

Figure 16:
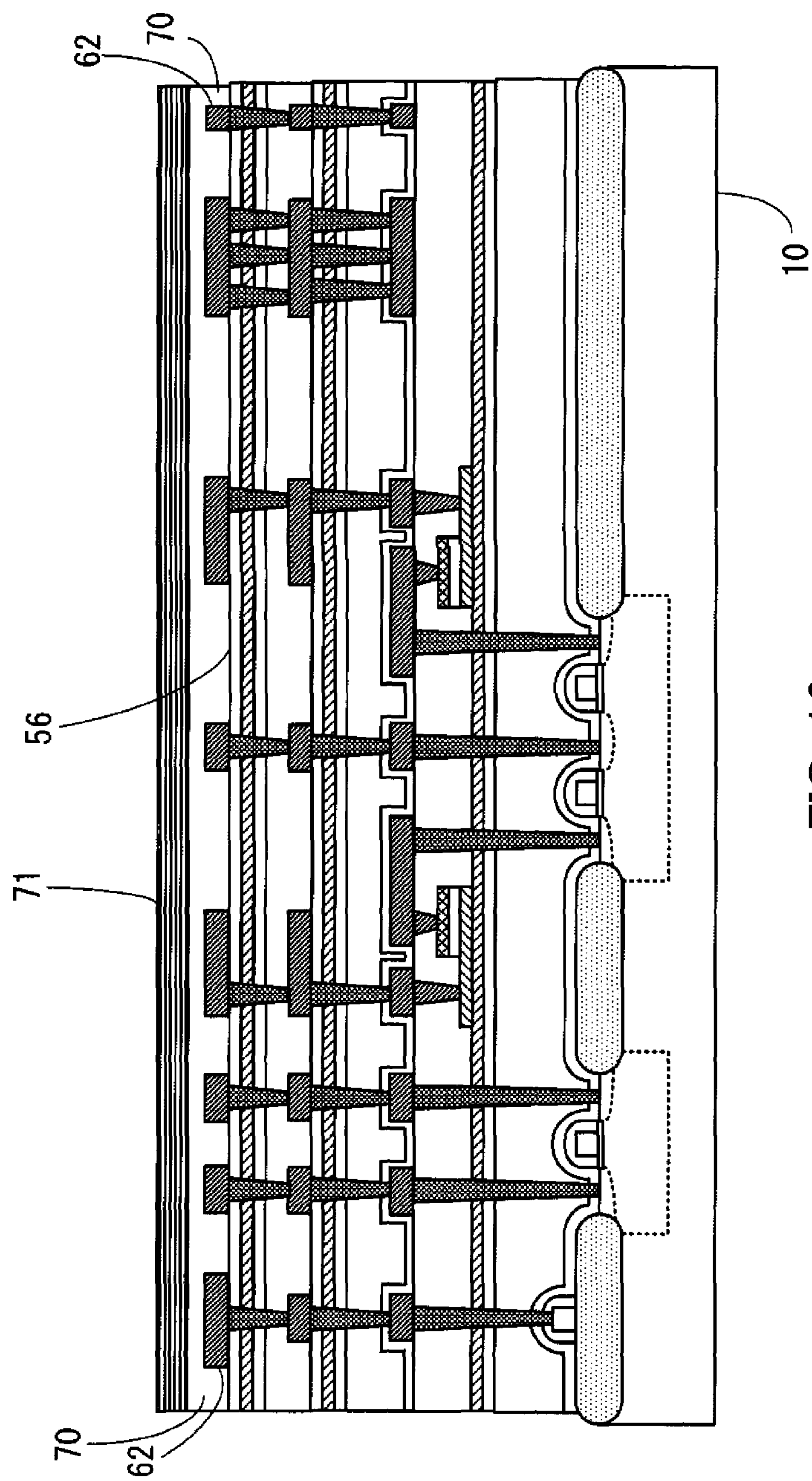
FIG. 16 is a fragmentary sectional view for describing the process for fabricating the FeRAM (part 15).

FIG. 16 is a fragmentary sectional view for describing the process for fabricating the FeRAM.

A TEOS-NSG film 70 with a thickness of 100 nm is formed as a passivation film over the laminated film 62 and the TEOS-NSG film 56 by, for example, the CVD method.

In order to nitride the surface of the TEOS-NSG film 70, plasma anneal is then performed at a temperature of 350° C. for 2 minutes by the use of, for example, the CVD system. In this case, nitrogen gas and oxygen gas are used for generating plasma.

In addition, a silicon nitride (SiN) film 71 with a thickness of 350 nm is formed as a passivation film over the TEOS-NSG film 70 by, for example, the CVD method.

The ferroelectric layer is damaged by bias at the time of forming the TEOS-NSG film 70 and the SiN film 71. In addition, the ferroelectric layer is damaged by plasma and heat at the time of performing the plasma anneal. Accordingly, in these steps integral values are assigned according to the order in which the Si wafer substrates are treated. After each step is completed, the Si wafer substrates are rearranged in the lot. The next treatment is then performed.

Figure 17:
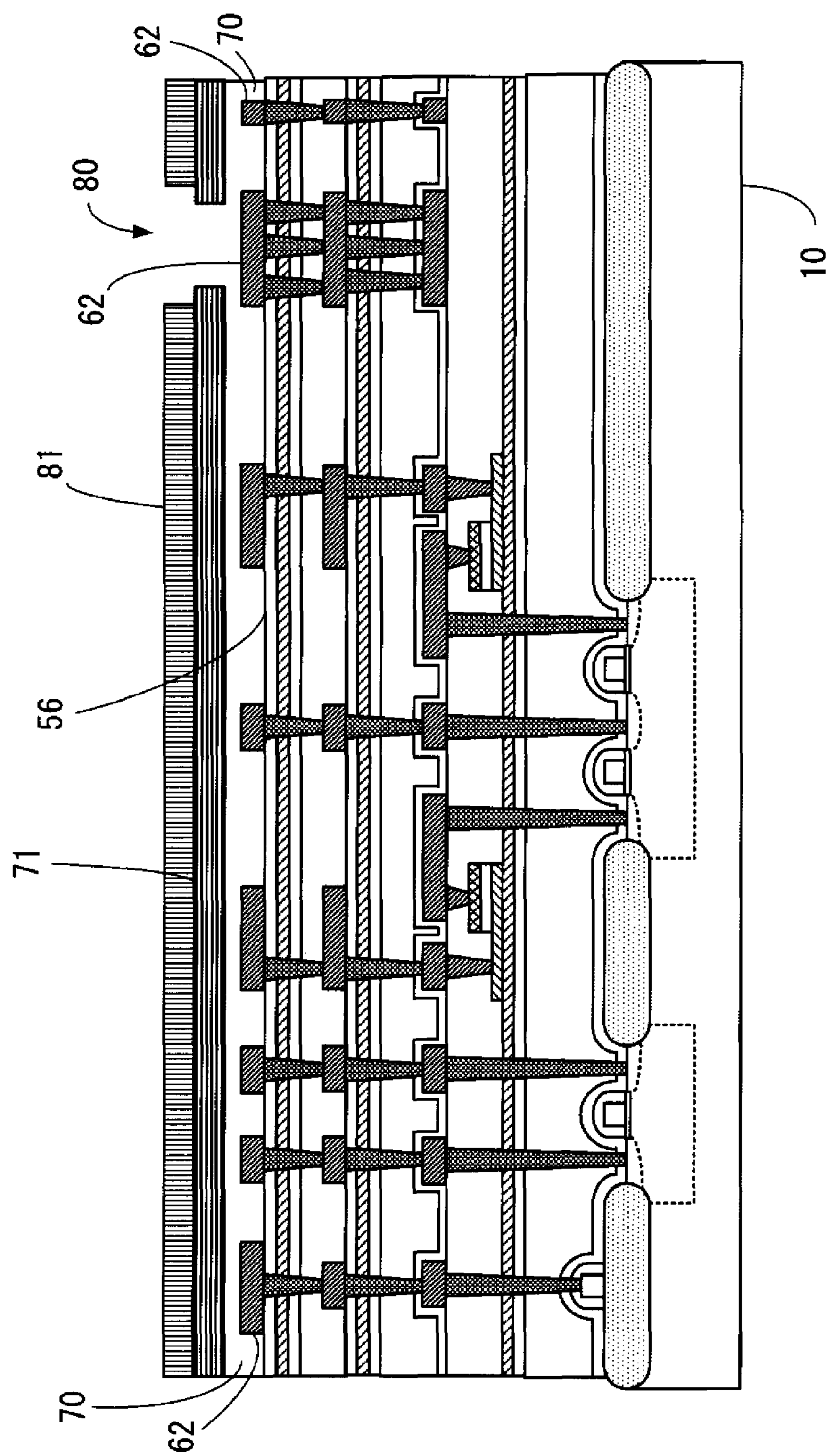
FIG. 17 is a fragmentary sectional view for describing the process for fabricating the FeRAM (part 16).

FIG. 17 is a fragmentary sectional view for describing the process for fabricating the FeRAM.

In order to form a pad portion 80, photoresist is applied to the SiN film 71, patterning is performed on the photoresist, and the SiN film 71 and the TEOS-NSG film 70 are etched with the photoresist as a mask (not shown). At this time the TiN film with a thickness of 150 nm which is the upper portion of the laminated film 62 is also etched (not shown).

After the pad portion 80 is formed, photosensitive polyimide is applied to form a protection film with a thickness of 3 μm. If nonphotosensitive polyimide is used, a photoresist pattern is formed over nonphotosensitive polyimide and nonphotosensitive polyimide is dissolved away by a dedicated developer. A polyimide film 81 is formed so as to protect the substrate except the pad portion 80.

After the polyimide film 81 is formed, heat treatment is performed by the use of a horizontal type furnace under the condition that, for example, temperature is 310° C., a nitrogen gas flow rate is 100 liters/minute, and time is 40 minutes. By doing so, the polyimide film 81 is hardened.

The ferroelectric layer is damaged by plasma at the time of performing the etching. In addition, the ferroelectric layer is damaged by heat at the time of hardening the polyimide film 81. Accordingly, in these steps integral values are assigned according to the order in which the Si wafer substrates are treated. After the process is completed, the Si wafer substrate 10 included in the lot is taken out. The integral values assigned in the above descriptions are added according to Si wafer substrate 10 each time rearrangement is performed.

FIGS. 18 and 19 are lists of a damage in each step.

The steps which correspond to the above-mentioned sectional views and in which the ferroelectric layer is damaged are marked with circles. As shown in FIGS. 18 and 19, the ferroelectric layer is damaged by plasma, heat, or bias.

A damage to the ferroelectric layer is caused by plasma in which electron density is higher than or equal to $10^8/cm^3$. A damage to the ferroelectric layer by heat occurs when the temperature of the substrate is higher than or equal to 300° C. A damage to the ferroelectric layer is caused by bias applied to the Si wafer substrate at the time of 200 W or more of discharge power being applied.

Each damage may be treated as one damage. If a plurality of damages occur at the same time, the plurality of damages may be treated as one damage.

That is to say, a damage by plasma, a damage by heat, and a damage by bias described above are managed independently of one another. The rearrangement of the Si wafer substrates for each damage is performed in the same way that is described above. In addition, assignment of integral values and addition are performed according to damage. This enables damage distribution. In other words, integral values to be assigned may be changed according to damage.

If damages are caused at the same time by at least two of plasma, heat, and bias, these damages are managed as one damage and the rearrangement of the Si wafer substrates, assignment of integral values, and addition are performed in the same way that is described above. This leads to damage distribution.

In order to uniformly distribute damages to the Si wafer substrates, the Si wafer substrates may be rearranged in steps other than those shown in FIGS. 18 and 19.

To be concrete, the Si wafer substrates may be rearranged in steps in FIGS. 2 through 17 in which the Si wafer substrates are exposed to gas that contains hydrogen. For example, silane ($SiH_4$) and ammonia ($NH_3$) are used in the step for forming the SiN film or the SiON film. After the Si wafer substrates are exposed to these gases, the Si wafer substrates may be rearranged. Tungsten hexafluoride ($WF_6$), hydrogen ($H_2$), and $SiH_4$ are used in the steps for forming the W film. After the Si wafer substrates are exposed to these gases, the Si wafer substrates may be rearranged.

In addition, the Si wafer substrates may be rearranged after the recovery anneal is performed in the steps in FIGS. 2 through 17. Specifically, the Si wafer substrates may be rearranged in the steps in which heating is performed at a temperature of 350° C. or higher in an atmosphere that contains oxygen. More specifically, if an oxygen gas flow rate in a treatment chamber is higher than or equal to 10 liters/minute, the Si wafer substrates may be rearranged after recovery anneal is performed at a temperature of 350 to 680° C. for 20 to 60 minutes.

If an oxygen gas flow rate is lower than 10 liters/minute, the effect of recovering the function of each ferroelectric capacitor is insufficient. If annealing temperature is lower than 350° C., it is difficult to diffuse oxygen into each ferroelectric capacitor. If annealing temperature is higher than or equal to 700° C., the resistance of a bulk contact becomes high. If annealing time is shorter than 20 minutes, oxygen does not diffuse sufficiently into each ferroelectric capacitor. Accordingly, annealing time is set to 20 to 60 minutes.

As stated above, the Si wafer substrates may be rearranged after crystallization anneal is performed on each ferroelectric capacitor. By doing so, ferroelectric capacitors uniformly crystallize over each Si wafer substrate.

If the Si wafer substrates are rearranged after recovery anneal is performed on each ferroelectric capacitor, the amount of recovery may be subtracted from the total amount of damages to each Si wafer substrate. That is to say, assignment of integral values and subtraction are performed according to the amount of recovery. Control is exercised so that the total amount of damages will not exceed a threshold. By doing so, uniform ferroelectric capacitors can be formed over each Si wafer substrate.

FIGS. 20 and 21 are views for describing the flow of rearrangement, assignment of integral values, and addition.

FIGS. 20 and 21 show an example of the rearrangement of Si wafer substrates, assignment of integral values, and addition. This example is based on the lists of a damage in each step shown in FIGS. 18 and 19. It is assumed that one lot is made up of twelve Si wafer substrates and that each ferroelectric layer is damaged only by plasma. "Si Substrate Number" in FIGS. 20 and 21 indicates a number given in advance for differentiating a Si wafer substrate from the others. The Si wafer substrates are treated in the direction of left to right in FIGS. 20 and 21. That is to say, the direction of left to right in FIGS. 20 and 21 indicates the order in which the Si wafer substrates are treated.

In step A plasma treatment is performed first in the order of the 1st through 12th Si wafer substrates. The integral value "4" is assigned to 1st Si wafer substrate as the amount of a damage. The integral values "3," "2," and "1" are assigned to 2nd through 4th Si wafer substrates respectively. The Si wafer substrates are rearranged before step B is performed. In step B plasma treatment is performed. The integral value "4" is assigned to 1st Si wafer substrate as the amount of a damage. The integral values "3," "2," and "1" are assigned to 2nd through 4th Si wafer substrates respectively. The Si wafer substrates are rearranged before step C is performed. After plasma treatment is performed in step C, the integral value "4" is assigned to 1st Si wafer substrate as the amount of a damage and the integral values "3," "2," and "1" are assigned to 2nd through 4th Si wafer substrates respectively.

Each time rearrangement is performed, the integral values assigned are added. That is to say, the total amount of damages to a ferroelectric layer of, for example, the number 7 Si wafer substrate caused by plasma in steps A through C is five. In the next step D, the Si wafer substrates are rearranged in the same way, integral values are assigned, and addition is performed. The same procedure is performed in all the steps.

FIGS. 22A and 22B are views for describing damage distribution. FIG. 22A is a view showing a total amount before damage distribution. FIG. 22B is a view showing a total amount after the damage distribution.

In the case of FIG. 22A, the Si wafer substrates are not rearranged and damages to each ferroelectric layer caused by plasma are not distributed. If the Si wafer substrates are not rearranged, the total amount of damages to a ferroelectric layer of the 1st Si wafer substrate is the largest as shown in FIG. 22A. With the 2nd through 4th Si wafer substrates, the total amount of damages to a ferroelectric layer gradually decreases.

In FIG. 22B, on the other hand, ferroelectric layers of all the Si wafer substrates are damaged. It is assumed that the threshold of the total amount of damages by plasma is "24". In FIG. 22A, the total amounts of damages to the ferroelectric layers of the 1st through 4th Si wafer substrates exceed the threshold. In FIG. 22B, the total amounts of damages to the ferroelectric layers of all the Si wafer substrates are smaller than the threshold.

As stated above, integral values are assigned in each step and the total amount of damages to each ferroelectric layer is managed. By doing so, conditions under which treatment is performed can be controlled so that the total amount of damages to each ferroelectric layer will not exceed the threshold.

The above method applied to damages by plasma can also be applied to damages by heat or bias. That is to say, the rearrangement of the Si wafer substrates, assignment of integral values, and addition should be performed in the same way. By doing so, damages by heat or bias can be distributed.

The effect of the above rearrangement was examined. Results obtained will now be described. In order to check the effect of the rearrangement, the difference between effects obtained in the case where rearrangement is not performed and the case where rearrangement is performed will be described.

One lot is made up of twenty-four Si wafer substrates. In order to compare the effects obtained in the case where rearrangement is not performed and the case where rearrangement is performed, probing test (PT) ratios were calculated.

Example 1

Figure 23:
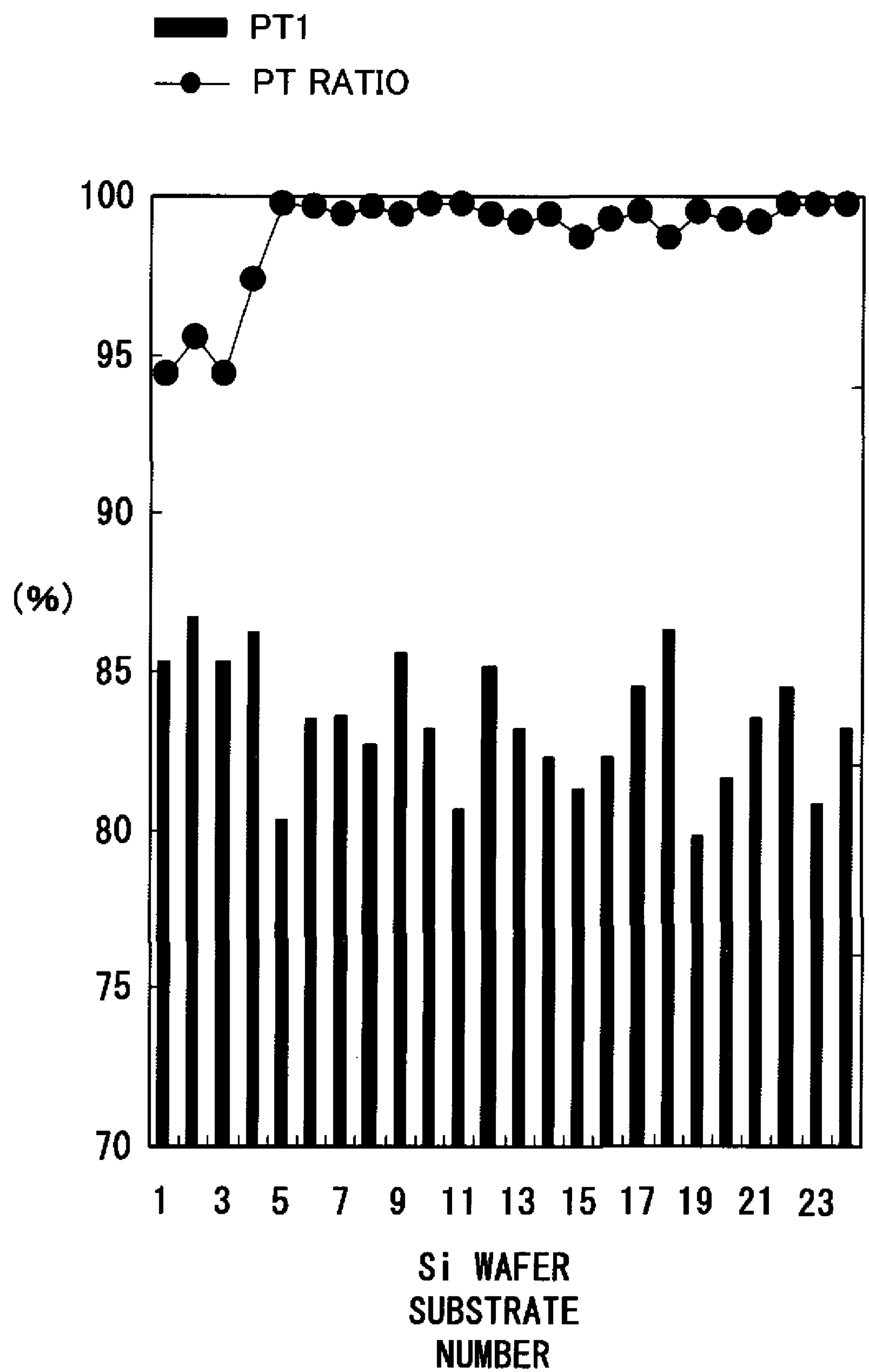
FIG. 23 is a view showing the relationship between wafer substrates and PT ratios which exists in the case of not rearranging the wafer substrates.

FIG. 23 is a view showing the relationship between wafer substrates and PT ratios which exists in the case of not rearranging the wafer substrates.

"PT1" shown in FIG. 23 is the result of a test for checking the operation of a semiconductor element having a ferroelectric capacitor. To be concrete, whether transistor circuits operate normally and whether the data "0" and the data "1" are written normally to a ferroelectric capacitor are checked for all elements formed on a Si wafer substrate and the ratio of elements which normally operate to all the elements is shown in a percentage.

After that, thermal aging treatment is performed (at a temperature of 200 to 250° C. for 24 hours) to thermally degrade each ferroelectric capacitor. With a ferroelectric capacitor a damage to which exceeds a threshold, the amount of residual dielectric polarization decreases because of the heating and the capability to hold the data "0" and the data "1" is lost. The data "0" and the data "1" are then written again. A data holding test is performed to check whether the data is recorded correctly. This test is referred to as a PT2 test.

Thermal aging treatment is performed again to degrade each ferroelectric capacitor. The data "0" and the data "1" are then written again. A data holding test is performed to check whether the data is recorded correctly. This test is referred to as a PT3 test.

"PT Ratio" shown in FIG. 23 is calculated by the use of (PT3/PT1)×100(%) and indicates the data holding capability of a durable ferroelectric capacitor. Accordingly, the higher a PT ratio grows, the more durable the ferroelectric capacitor becomes. That is to say, the higher a PT ratio grows, the higher the performance of the ferroelectric capacitor becomes.

As can be seen from FIG. 23, a PT ratio for each of the 5th through 23rd Si wafer substrates is near 100% if the Si wafer substrates are not rearranged. However, a PT ratio for each of the 1st through 4th Si wafer substrates is low. That is to say, as shown in FIG. 23, a PT ratio for each of the 1st through 4th Si wafer substrates considerably damaged is low.

Example 2

Figure 24:
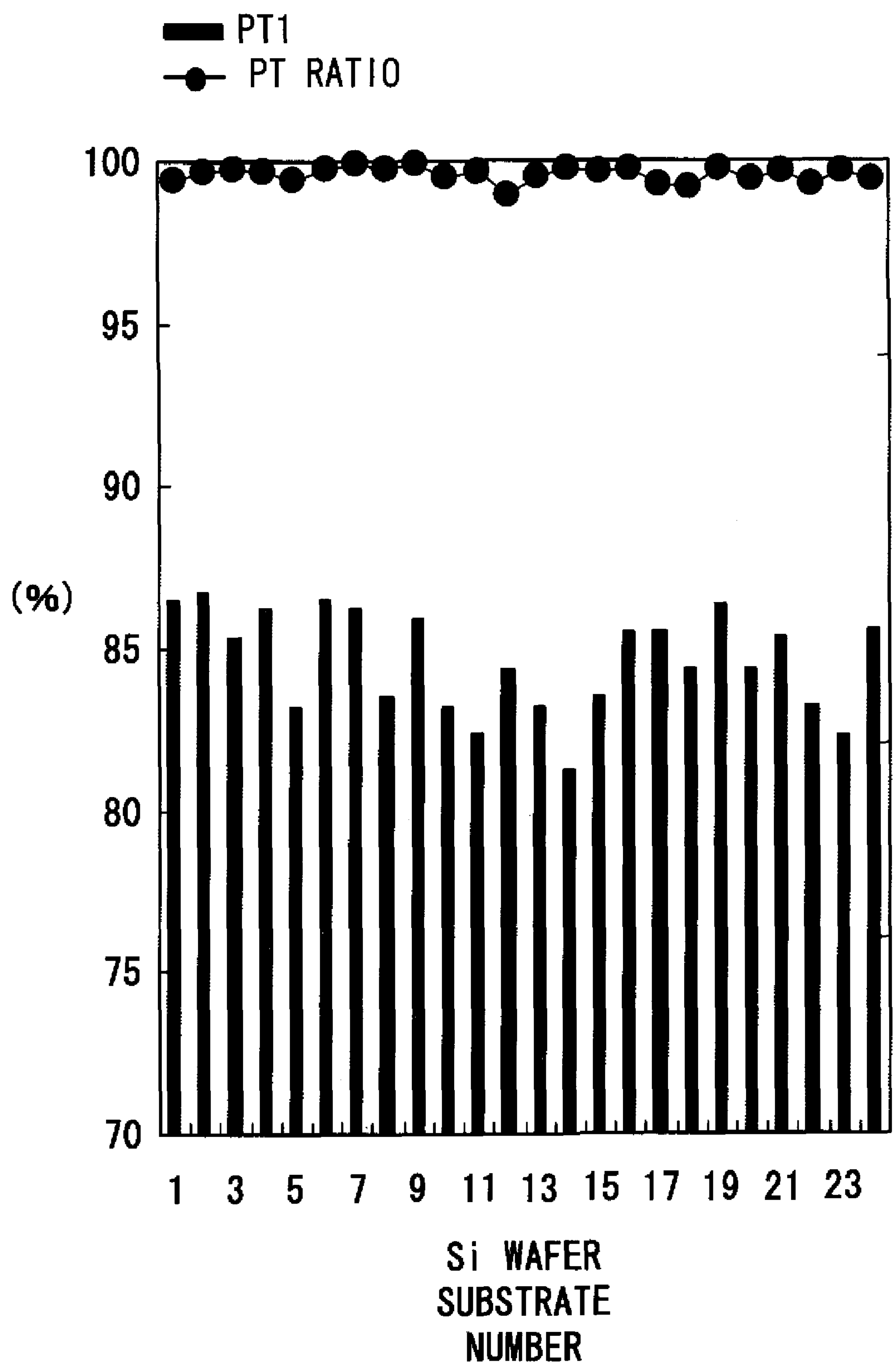
FIG. 24 is a view showing the relationship between wafer substrates and PT ratios which exists in the case of rearranging the wafer substrates.

FIG. 24 is a view showing the relationship between wafer substrates and PT ratios which exists in the case of rearranging the wafer substrates.

FIG. 24 shows PT ratios for the Si wafer substrates which are rearranged in the above way at the time of being damaged by, for example, plasma.

As can be seen from FIG. 24, the PT ratios for all of the Si wafer substrates which make up the one lot approach 100% by rearranging the Si wafer substrates in the above way. That is to say, Si wafer substrates damaged by plasma, heat, or bias are rearranged in a step according to the predetermined rule so that damages will not be concentrated on a specific Si wafer substrate. As a result, the PT ratios for all of the Si wafer substrates are near 100%.

As stated above, damages which occur in a process are distributed among Si wafer substrates which make up one lot. By doing so, control is exercised so that the total amount of damages to each ferroelectric layer will not exceed a threshold. Accordingly, the damages are not accumulated in a ferroelectric layer of a specific Si wafer substrate. As a result, the data holding function of each FeRAM is maintained and variation in retention failure among wafers can be reduced. Accordingly, as shown in FIG. 24, the total production yield of FeRAMs improves.

In the descriptions of the above embodiment a planar capacitor is used as an example of the ferroelectric capacitor. However, the ferroelectric capacitor may be a stack capacitor. In addition, the present invention is not limited to the fabrication of an FeRAM. That is to say, the present invention is applicable to the fabrication of a DRAM or a flash memory.

In the above descriptions only the Si wafer substrates treated first, second, and third in the lot are rearranged. However, the number of Si wafer substrates rearranged is not limited to three. Two to five Si wafer substrates may be rearranged.

In the method for fabricating a semiconductor device with a ferroelectric capacitor according to the present embodiment, a plurality of substrates are rearranged before treatment in each step in which ferroelectric layers formed over the plurality of substrates may be damaged.

As a result, a method for efficiently fabricating semiconductor devices each having a ferroelectric capacitor by which retention characteristic variations among wafer substrates in the same lot are reduced can be provided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device, comprising:

forming a ferroelectric layer over a plurality of substrates; and rearranging a treatment order of the plurality of substrates, wherein the treatment includes a potential process for damaging the ferroelectric layer, and wherein when the plurality of substrates are rearranged, amounts of damages to the ferroelectric layer assigned in advance according to order in which the plurality of substrates are treated are added each time rearrangement is performed.

2. The method according to claim 1, wherein: the amounts of the damages are represented as integers; and values of the integers change according to the order in which the plurality of substrates are treated.

3. The method according to claim 1, wherein, in a case where there are n substrates, substrates treated first, . . . , and m-th (m<6) are replaced at nth through [n−(m−1)]-th positions respectively each time when the n substrates are rearranged.

4. The method according to claim 3, wherein: n is greater than or equal to 3; and m is smaller than or equal to 2 if n is 3, m is smaller than or equal to 3 if n is 4, m is smaller than or equal to 4 if n is 5, and m is smaller than or equal to 5 if n is greater than or equal to 6.

5. The method according to claim 1, wherein:

a number of the plurality of substrates which make up one lot is n (n>13);

when the plurality of substrates are rearranged, the plurality of substrates are divided into two (first and second) groups;

if n is an even number, substrates of the first group treated first, second, and third are replaced at (n/2)-th through [(n/2)−2]-th positions respectively at the time of performing each rearrangement and substrates of the second group treated (n−2)-th, (n−1)-th, and n-th are replaced at [(n/2)+3]-th through [(n/2)+1]-th positions respectively at the time of performing each rearrangement; and if n is an odd number, substrates of the first group treated first, second, and third are replaced at [(n−1)/2]-th through {[(n−1)/2]−2}-th positions respectively at the time of performing each rearrangement and substrates of the second group treated (n−2)-th, (n−1)-th, and n-th are replaced at {[(n−1)/2]+3}-th through {[(n−1)/2]+1}-th positions respectively at the time of performing each rearrangement or the substrates of the first group treated first, second, and third are placed at [(n+1)/2]-th through {[(n+1)/2]+2}-th positions respectively at the time of performing each rearrangement and the substrates of the second group treated (n−2)-th, (n−1)-th, and nth are placed at {[(n+1)/2]+3}-th through {[(n+1)/2]+1}-th positions respectively at the time of performing each rearrangement.

6. The method according to claim 1, wherein a damage is caused by plasma, heat, gas which contains hydrogen, or bias.

7. The method according to claim 6, wherein the damages are caused by the plasma when electron density in the plasma is higher than or equal to $10^8/cm^3$.

8. The method according to claim 6, wherein the damages are caused by the heat when temperature of the plurality of substrates is equal to or higher than 300° C.

9. The method according to claim 6, wherein the damages are caused by the bias when 200 W or more of discharge power is applied.

10. The method according to claim 1, wherein the damages are caused at the same time by at least two of plasma, heat, and bias.

11. The method according to claim 10, wherein if the damages are caused at the same time by at least two of plasma, heat, and bias, the damages caused at the same time are considered as one damage.

12. The method according to claim 1, wherein the semiconductor device is a ferroelectric memory.

13. The method according to claim 1, wherein the plurality of substrates are rearranged after crystallization anneal is performed on a ferroelectric capacitor.

14. The method according to claim 6, wherein the gas which contains hydrogen is silane, ammonia, tungsten hexafluoride, and hydrogen.

15. The method according to claim 1, wherein the plurality of substrates are rearranged after heating is performed in an atmosphere that contains oxygen at a temperature of 350° C. or higher.

16. The method according to claim 15, wherein an oxygen flow rate is equal to or higher than 10 liters/minute.

17. The method according to claim 15, wherein temperature of the atmosphere that contains oxygen is equal to or higher than 350° C. and equal to or lower than 680° C.

18. The method according to claim 15, wherein time for which the plurality of substrates are treated in the atmosphere that contains oxygen is equal to or longer than 20 minutes.

19. The method according to claim 1, wherein if the ferroelectric layers are treated in a recovery anneal, recovery amounts are subtracted from total amounts of the damages to the plurality of substrates.

20. A method for fabricating a semiconductor device, comprising:

forming a ferroelectric layer over a plurality of substrates; and rearranging a treatment order of the plurality of substrates, wherein the treatment includes a potential process for damaging the ferroelectric layer, wherein, in a case where there are n substrates, substrates treated first, . . . , and m-th (m<6) are replaced at nth through [n−(m−1)]-th positions respectively each time when the n substrates are rearranged.

* * * * *